US010727115B2

(12) United States Patent
Nam et al.

(10) Patent No.: US 10,727,115 B2
(45) Date of Patent: Jul. 28, 2020

(54) THREE-DIMENSIONAL SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Phil Ouk Nam, Suwon-si (KR); Jaeyoung Ahn, Seongnam-si (KR); Sangsoo Lee, Seoul (KR)

(73) Assignee: Samsung Electronics co., Ltd., Gyeonggi-do (KR)

(*) Notice: Subject to any disclaimer, the term of this patent is extended or adjusted under 35 U.S.C. 154(b) by 0 days.

(21) Appl. No.: 16/460,598

(22) Filed: Jul. 2, 2019

(65) Prior Publication Data

US 2019/0326166 A1    Oct. 24, 2019

Related U.S. Application Data

(63) Continuation of application No. 15/805,560, filed on Nov. 7, 2017, now Pat. No. 10,395,982.

(30) Foreign Application Priority Data

Jul. 7, 2017    (KR) .................. 10-2017-0086597

(51) Int. Cl.
*H01L 21/768*    (2006.01)
*H01L 27/11524*    (2017.01)
(Continued)

(52) U.S. Cl.
CPC .. *H01L 21/76829* (2013.01); *H01L 21/76805* (2013.01); *H01L 21/76816* (2013.01);
(Continued)

(58) Field of Classification Search
CPC .......... H01L 21/76829; H01L 23/5226; H01L 21/76877; H01L 21/76816; H01L 23/5283;
(Continued)

(56) References Cited

U.S. PATENT DOCUMENTS 6,424,044 B1    7/2002    Han et al.
6,764,901 B2    7/2004    Noble et al.
(Continued)

FOREIGN PATENT DOCUMENTS

KR    10-2014-0025798 A    3/2014

OTHER PUBLICATIONS

"Boron and high-k dielectrics: Possible fourth etch stop colors for multipattern optical lithography processing," Journal of Vacuum Science & Technology A, No. 35, 021510, pp. 1-3 (2017).

*Primary Examiner* — Victor A Mandala
(74) *Attorney, Agent, or Firm* — Harness, Dickey & Pierce, P.L.C.

(57) ABSTRACT

Provided is a semiconductor device including a lower layer structure on a substrate, the lower layer structure having different thicknesses on first and second regions of the substrate, the lower layer structure including an electrode layer at a top and an insulating layer thereunder, an etch stop layer on the lower layer structure, an upper layer structure on the etch stop layer, the etch stop layer having an etch selectivity to the upper and lower layer structures, first and second contact plugs filling first and second openings defined in the upper layer structure and the etch stop layer on the first and second regions, respectively, and contacting corresponding electrode layers of the lower layer structure, respectively, such that one of the first and second contact (Continued)

plugs downwardly extends further with respect to a bottom of the etch stop layer than the other one of the first and second contact plugs.

20 Claims, 41 Drawing Sheets

(51) Int. Cl.

| | |
|---|---|
| *H01L 27/11556* | (2017.01) |
| *H01L 27/1157* | (2017.01) |
| *H01L 27/11582* | (2017.01) |
| *H01L 23/528* | (2006.01) |
| *H01L 23/522* | (2006.01) |
| *H01L 27/11575* | (2017.01) |
| *G11C 16/30* | (2006.01) |
| *G11C 16/08* | (2006.01) |
| *G11C 16/04* | (2006.01) |
| *H01L 27/11565* | (2017.01) |

(52) U.S. Cl.
CPC .... *H01L 21/76877* (2013.01); *H01L 23/5226* (2013.01); *H01L 23/5283* (2013.01); *H01L 27/1157* (2013.01); *H01L 27/11524* (2013.01); *H01L 27/11556* (2013.01); *H01L 27/11575* (2013.01); *H01L 27/11582* (2013.01); *G11C 16/0483* (2013.01); *G11C 16/08* (2013.01); *G11C 16/30* (2013.01); *H01L 27/11565* (2013.01)

(58) Field of Classification Search
CPC ......... H01L 27/11524; H01L 27/11582; H01L 27/1157; H01L 27/11556; G11C 16/08; G11C 16/30
See application file for complete search history.

(56) References Cited

U.S. PATENT DOCUMENTS

| | | | |
|---|---|---|---|
| 7,170,126 B2 | 1/2007 | Cheng et al. | |
| 7,183,222 B2 | 2/2007 | Qiao | |
| 7,855,457 B2 | 12/2010 | Mizukami et al. | |
| 7,989,880 B2* | 8/2011 | Wada | H01L 21/76808 257/314 |
| 8,704,288 B2* | 4/2014 | Lee | H01L 27/11519 257/316 |
| 9,230,904 B2 | 1/2016 | Eun et al. | |
| 9,305,830 B2 | 4/2016 | Park et al. | |
| 9,305,935 B2* | 4/2016 | Lee | H01L 21/76816 |
| 9,419,013 B1* | 8/2016 | Lee | H01L 27/11582 |
| 9,711,603 B2* | 7/2017 | Lim | H01L 23/485 |
| 2012/0070944 A1 | 3/2012 | Kim et al. | |
| 2013/0313627 A1* | 11/2013 | Lee | H01L 21/76816 257/324 |
| 2014/0054789 A1* | 2/2014 | Chiu | H01L 21/76816 257/774 |
| 2015/0005417 A1 | 1/2015 | Timberlake et al. | |
| 2015/0054170 A1* | 2/2015 | Ko | H01L 23/5329 257/774 |
| 2015/0255484 A1* | 9/2015 | Imamura | H01L 27/11582 257/314 |
| 2016/0056165 A1* | 2/2016 | Imamura | H01L 27/1157 257/324 |
| 2016/0099170 A1 | 4/2016 | Eun et al. | |
| 2016/0343821 A1* | 11/2016 | Chiou | H01L 29/458 |
| 2017/0077026 A1 | 3/2017 | Okawa et al. | |
| 2017/0117222 A1* | 4/2017 | Kim | H01L 27/11575 |
| 2017/0278859 A1* | 9/2017 | Sharangpani | H01L 27/11573 |

* cited by examiner

THREE-DIMENSIONAL SEMICONDUCTOR DEVICE AND METHOD OF FABRICATING THE SAME

CROSS-REFERENCE TO RELATED APPLICATIONS

This U.S. nonprovisional patent application is a continuation of U.S. application Ser. No. 15/805,560, filed on Nov. 7, 2017, which claims priority under 35 U.S.C § 119 of Korean Patent Application No. 10-2017-0086597 filed on Jul. 7, 2017 in the Korean Intellectual Property Office (KIPO), the entire contents of each of which are hereby incorporated by reference.

BACKGROUND

The present disclosure relates to semiconductor devices and/or methods of fabricating the same, and more particularly, to highly integrated three-dimensional semiconductor devices and/or methods of fabricating the same.

Semiconductor devices have been highly integrated to meet high performance and/or low manufacturing costs requirements of users. Because a degree of integration of the semiconductor devices is an important factor in determining product price, high integration is increasingly demanded. Therefore, there have been proposed three-dimensional semiconductor memory devices having three-dimensionally arranged memory cells.

SUMMARY

Some example embodiments of the present inventive concepts provide three-dimensional semiconductor devices and/or methods of fabricating the same having an enhanced integration.

The present inventive concepts are not limited to the above-mentioned example embodiments. Other example embodiments which have not been mentioned above will be clearly understood to those skilled in the art from the following description.

According to an example embodiment, a semiconductor device includes a substrate including a first region and a second region, a lower layer structure on the substrate, the lower layer structure having a first thickness on the first region and a second thickness on the second region, the second thickness being greater than the first thickness, the lower layer structure including an electrode layer at a top and an insulating layer under the electrode layer, an etch stop layer on the lower layer structure, an upper layer structure on the etch stop layer, a top surface of the upper layer structure being substantially a same level on the first and second regions, the etch stop layer having an etch selectivity with respect to both the upper layer structure and the lower layer structure, a first contact plug filling a first opening, the upper layer structure and the etch stop layer including the first opening defined therethrough on the first region, the first contact plug being in connection with the electrode layer of the lower layer structure, and a second contact plug filling a second opening, the upper layer structure and the etch stop layer including the second opening defined therethrough on the second region, a bottom surface of the first contact plug having a first distance from a bottom surface of the etch stop layer and a bottom surface of the second contact plug having a second distance from the bottom surface of the etch stop layer, the first distance being different from the second distance.

According to an example embodiment, a semiconductor device includes a substrate including a first region and a second region, a lower layer structure on the substrate, the lower layer structure having a first thickness on the first region and a second thickness on the second region, the second thickness being greater than the first thickness, the lower layer structure including an electrode layer at a top and an insulating layer under the electrode layer, an amorphous boron layer on the lower layer structure, an upper layer structure on the amorphous boron layer, a top surface of the upper layer structure being substantially a same level on the first and second regions, the amorphous boron layer having an etch selectivity with respect to both the upper layer structure and the lower layer structure, a first contact plug filling a first opening, the upper layer structure and the amorphous boron layer including the first opening defined therethrough on the first region, the first contact plug being in connection with the electrode layer of the lower layer structure, and a second contact plug filling a second opening, the upper layer structure and the amorphous boron layer including the second opening defined therethrough on the second region, the second contact plug being in connection with the electrode layer of the lower layer structure.

According to an example embodiment, a three dimensional (3D) semiconductor memory device includes a substrate including a cell array region and a connection region, a stack structure on the substrate, the stack structure being an alternating structure of conductive layers and insulating layers, the stack structure having a stepped shape in the connection region, the stepped shape including a plurality of steps, the plurality of steps including at least a first step and a second step, the second step being lower than the first step, the first step and the second step each including a conductive layer at a top and an insulating layer under the conductive layer, an etch stop layer on the stack structure, a layer structure on the etch stop layer, a top surface of the layer structure being substantially a same level on the cell array region and the connection region, the etch stop layer having an etch selectivity with respect to both the layer structure and the stack structure, a first contact plug filling a first opening, the layer structure and the etch stop layer including the first opening defined therethrough and reaching the conductive layer of the first step, and a second contact plug filling a second opening, the layer structure and the etch stop layer including defined therethrough and reaching the conductive layer of the second step, a bottom surface of the first contact plug being farther into the conductive layer of the layer structure from a bottom surface of the etch stop layer than a bottom surface of the second contact plug.

According to an example embodiment, a method of manufacturing a semiconductor device includes providing a substrate including a cell array region and a connection region, forming a stack structure on a substrate such that the stack structure has a stepped shape in the connection region, the stack structure being an alternating structure of conductive layers and insulating layers, the stepped shape including a plurality of steps, the plurality of steps including at least an upper step and a lower step, the upper step and the lower step each including a conductive layer at a top and an insulating layer under the conductive layer, forming an etch stop layer on the stack structure, forming a layer structure on the etch stop layer such that a top surface of the layer structure is substantially a same level on the cell array region and the connection region, the etch stop layer having an etch selectivity with respect to both the layer structure and the stack structure, forming a first opening through the layer structure and the etch stop layer on the upper step such that a bottom surface of the first opening has a first distance from a bottom surface of the etch stop layer, forming a second opening through the layer structure and the etch stop layer on the lower step such that a bottom surface of the second opening has a second distance from the bottom surface of the etch stop layer and the first distance is farther into the conductive layer of the stack structure from the bottom surface of the etch stop layer than the second distance, removing the etch stop layer remaining in the first and second openings, filling a first contact plug in the first opening and filling a second contact plug in the second opening to form an intermediate structure, and providing the semiconductor device employing the intermediate structure.

DETAILED DESCRIPTION

It will be hereinafter discussed semiconductor devices and/or methods of fabricating the same according to some example embodiments of the present inventive concepts in conjunction with the accompanying drawings.

FIGS. 1A to 1E illustrate cross-sectional views for explaining a method of fabricating a semiconductor device according to an example embodiment of the present inventive concepts.

Figure 1A:
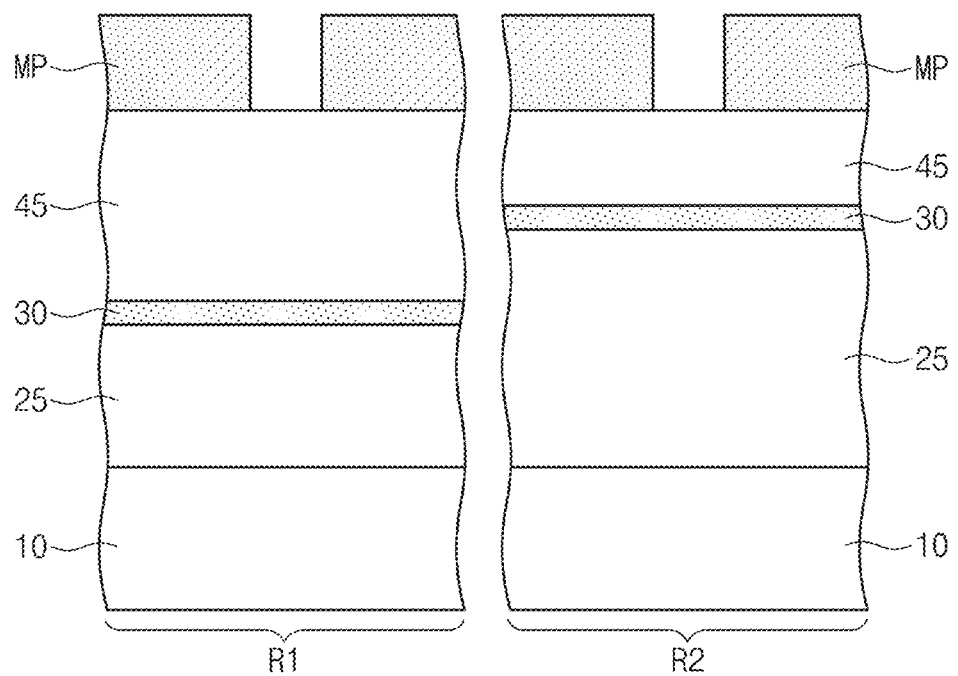
FIGS. 1A to 1E illustrate cross-sectional views for explaining a method of fabricating a semiconductor device according to an example embodiment of the present inventive concepts.

Referring to FIG. 1A, a lower layer 25, an etch stop layer 30, and an upper layer 45 may be sequentially stacked on a semiconductor substrate 10, which includes a first region R1 and a second region R2.

The lower layer 25 may have a first thickness on the first region R1 and a second thickness on the second region R2. The second thickness may be greater than the first thickness. A top surface of the lower layer 25 on the first region R1 may be lower than a top surface of the lower layer 25 on the second region R2. For example, the top surface of the lower layer 25 at the first region R1 may be located at a level different from the top surface of the lower layer 25 at the second region R2.

In some example embodiments, the lower layer 25 may include a single layer or a plurality of layers. The lower layer 25 may include a field effect transistor, a resistor, and/or electrical lines. For example, the lower layer 25 may include conductive patterns and insulation layers.

The etch stop layer 30 may have a substantially uniform thickness on the first and second regions R1 and R2, and may cover the top surface of the lower layer 25.

The upper layer 45 may have a top surface at substantially the same level on the first and second regions R1 and R2. For example, the upper layer 45 may include a single insulation layer or a plurality of insulation layers. In some example embodiments, the upper layer 45 may include conductive patterns and insulation layers.

In some example embodiments, the lower and upper layers 25 and 45 may include different materials from each other, and the etch stop layer 30 may include a material having an etch selectivity with respect to the lower and upper layers 25 and 45. For example, the lower layer 25 may include a metal material and the upper layer 45 may include an insulating material, and the etch stop layer 30 may include an amorphous boron layer, which contains about 90 to 100 atomic percent of boron (B). For example, the amorphous boron layer may be a substantially pure amorphous boron layer.

For example, the amorphous boron layer may be deposited on the lower layer 25 by chemical vapor deposition (CVD), plasma enhanced CVD (PECVD), high plasma density plasma CVD (HDP-CVD), or the like. In some example embodiments, the amorphous boron layer may be deposited at a process temperature of about 300° C. to about 800° C. When the amorphous boron layer is deposited, a boron source gas and a purge gas may be provided onto the lower layer 25. The boron source gas may include, for example, $B_2H_6$ (diborane), $BH_3$—$NH(CH_3)_2$ (borane-dimethylamine), B [($NCH_3)_2]_3$ (tris(dimethylamino)borane)), $BCl_3$ (trichloroborane), or $BBr_3$ (tribromoborane). The purge gas may include, for example, an N2 gas or an inert gas such as Ar, He, and/or Ne.

When a process for chemical vapor deposition is performed, the boron source gas may be thermally decomposed to chemically or physically adsorb and deposit boron on the top surface of the lower layer 25, thereby forming the amorphous boron layer. The amorphous boron layer formed by the above method may have an etch selectivity of more than about 1000:1 with respect to metal, silicon nitride, silicon oxide, or silicon oxynitride.

A mask pattern MP may be formed on the upper layer 45. On each of the first and second regions R1 and R2, the mask pattern MP may partially expose the upper layer 45.

Figure 1B:
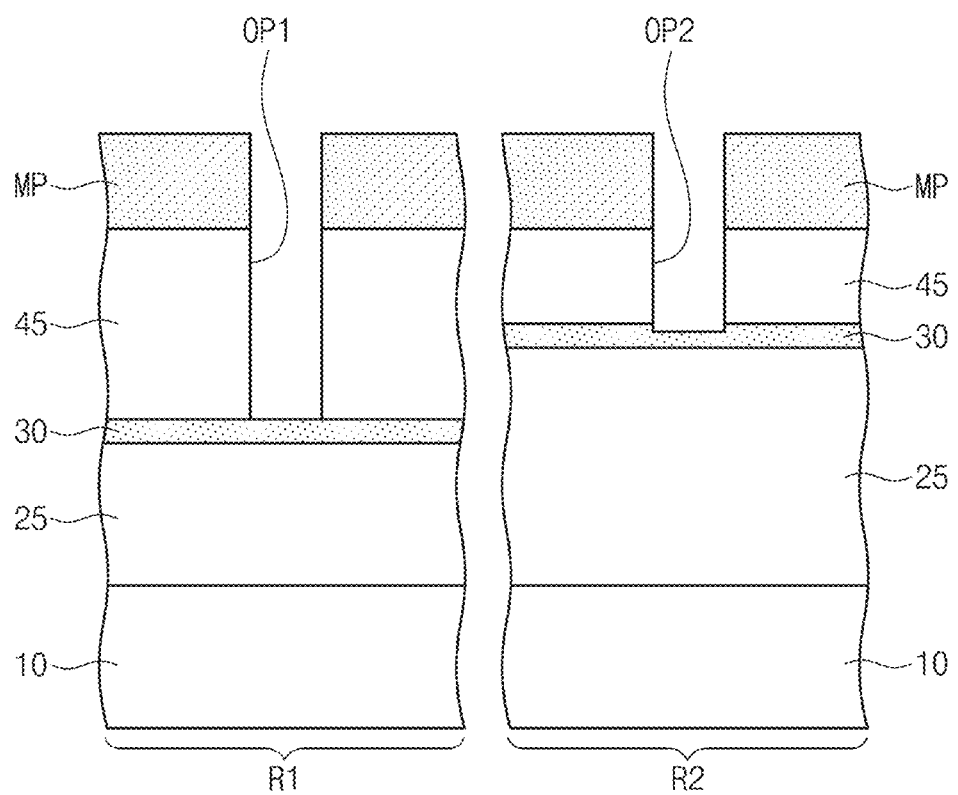

Referring to FIG. 1B, the mask pattern MP may be used as an etch mask to anisotropically etch the upper layer 45, and thereby first and second openings OP1 and OP2 may be formed on the first and second regions R1 and R2, respectively.

An etching process using plasma may be employed to anisotropically etch the upper layer 45 to form the first and second openings OP1 and OP2. For example, the anisotropic etching process may be a plasma etching process, a reactive ion etching (RIE) process, a high-frequency inductively coupled plasma reactive ion etching (ICP-RIE) process, or an ion beam etching (IBE) process.

The upper layer 45 may be anisotropically etched until the etch stop layer 30 is exposed. Because the etch stop layer 30 is positioned at different levels on the first and second regions R1 and R2, the etch stop layer 30 may have different thicknesses at its portions exposed in the first and second openings OP1 and OP2 when the anisotropic etching is completed. In some example embodiments, when the upper layer 45 is anisotropically etched, plasma and ions may physically etch the etch stop layer 30.

When the anisotropic etching is completed, a thickness of the etch stop layer 30 exposed in the first opening OP1 may be thicker than the etch stop layer 30 exposed in the second opening OP2. For example, when the upper layer 45 is anisotropically etched on the first region R1, the etch stop layer 30 exposed in the second opening OP2 on the second region R2 may be recessed.

In some example embodiments, while the upper layer 45 is being anisotropically etched on the first region R1, a portion of the etch stop layer 30 exposed in the second opening OP2 may be etched, and therefore the lower layer 25 may be partially exposed in the second opening OP2. Thus, when the first opening OP1 is formed, a top surface of the lower layer 25 in the second opening OP2 may be recessed.

Figure 1C:
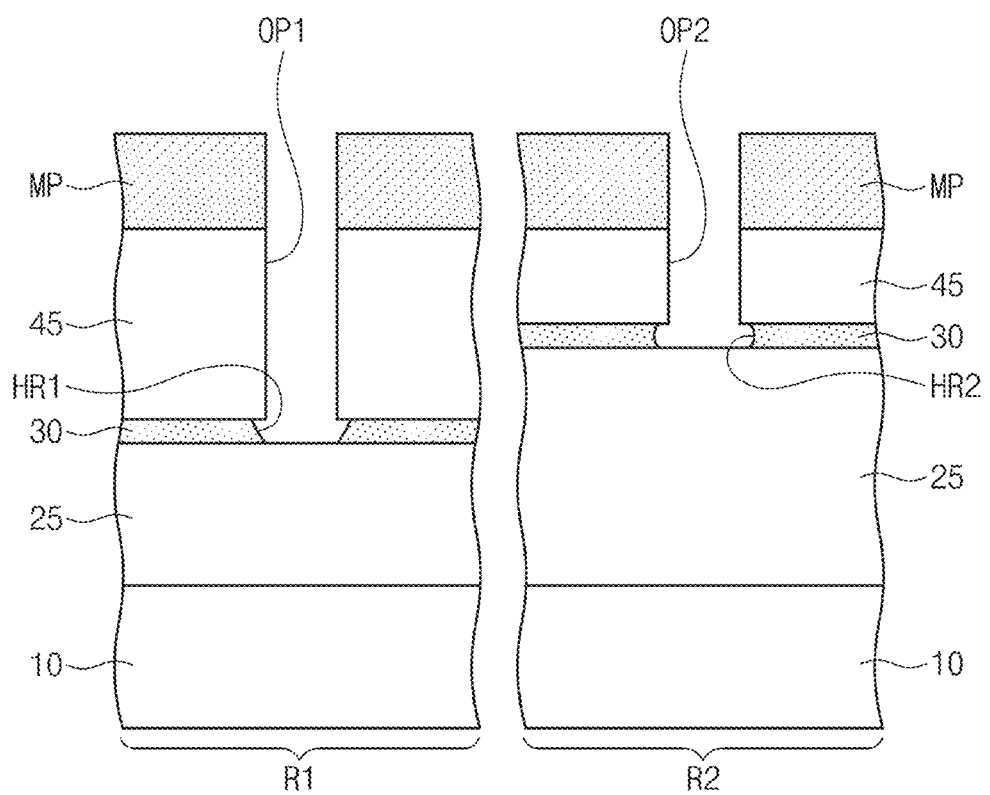

Referring to FIG. 1C, an isotropic etching process may be performed on the etch stop layer 30 exposed in the first and second openings OP1 and OP2. The isotropic etching process may form first and second lower holes HR1 and HR2, which penetrate the etch stop layer 30 and partially expose the lower layer 25 under the first and second openings OP1 and OP2, respectively.

When the etch stop layer 30 is isotropically etched, the isotropic etching process may use a wet etchant having an etch selectivity with respect to the lower and upper layers 25 and 45. In some example embodiments, the etch stop layer 30 consisting of the amorphous boron layer may be isotropically etched by a wet etchant (e.g., an SC1 solution) including hydrogen peroxide ($H_2O_2$).

For example, the wet etchant including hydrogen peroxide ($H_2O_2$) may etch the amorphous boron layer at an etch rate of more than about 0.8 nm/min. The amorphous boron layer may be etched by etchants, including nitric acid ($HNO_3$), sodium hydroxide (NaOH), hydrochloric acid (HCl), sulfuric acid ($H_2SO_4$) and/or phosphoric acid ($H_3PO_4$), at an etch rate of less than about 0.2 nm/min, less than about 0.1 nm/min, or less than 0.05 nm/min.

In some example embodiments, the etch stop layer 30 remaining in the first and second openings OP1 and OP2 on the first and second regions R1 and R2 may have different thicknesses. Accordingly, the isotropic etching process on the etch stop layer 30 may result in different sidewall profiles on the first and second lower holes HR1 and HR2.

For example, the first lower hole HR1 may have a width that decreases toward a bottom surface of the etch stop layer 30 from the top surface of the etch stop layer 30, and the second lower hole HR2 may have substantially the same width from the top to bottom surfaces of the etch stop layer 30. In some example embodiments, the first lower hole HR1 may have an inclined sidewall, and the second lower hole HR2 may have a rounded sidewall.

Figure 1D:
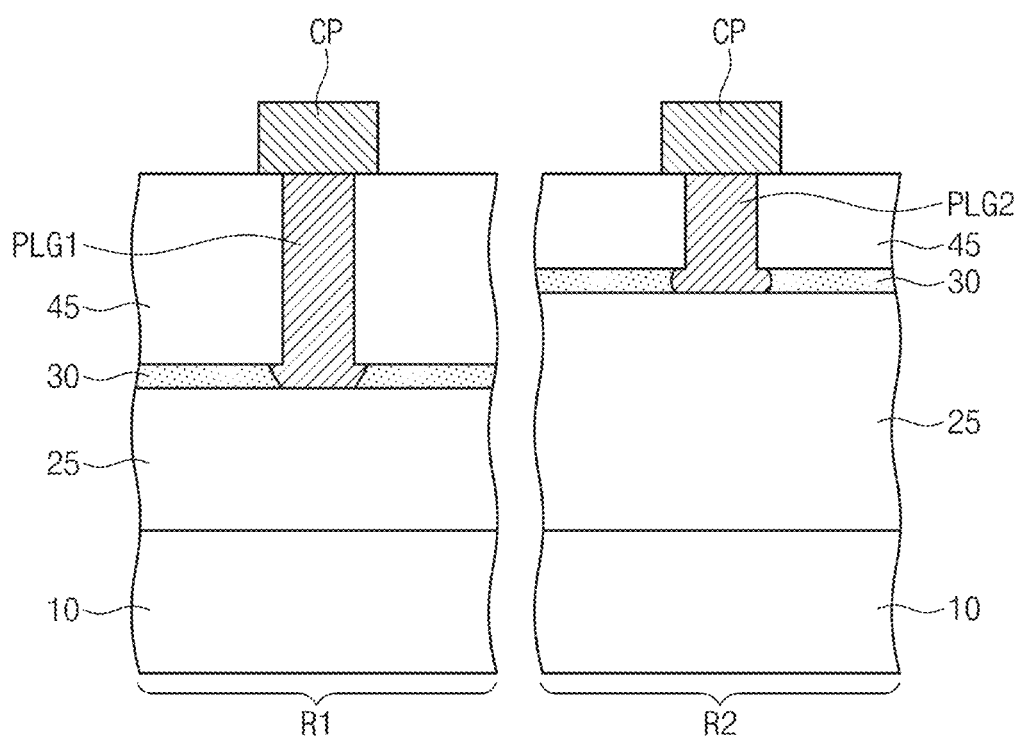

Referring to FIG. 1D, the first and second lower holes HR1 and HR2 and the first and second openings OP1 and OP2 may be filled with a conducive material. Thus, a first contact plug PLG1 may be formed in the first lower hole HR1 and the first opening HR1, and a second contact plug PLG2 may be formed in the second lower hole HR2 and the second opening OP2. Further, conductive patterns CP may be formed on the first and second contact plugs PLG1 and PLG2, respectively. The first and second contact plugs PLG1 and PLG2 may be in direct contact with the lower layer 25, and each of the first and second contact plugs PLG1 and PLG2 may have a first width in the upper layer 45 and a second width greater than the second width in the etch stop layer 30.

Figure 1E:
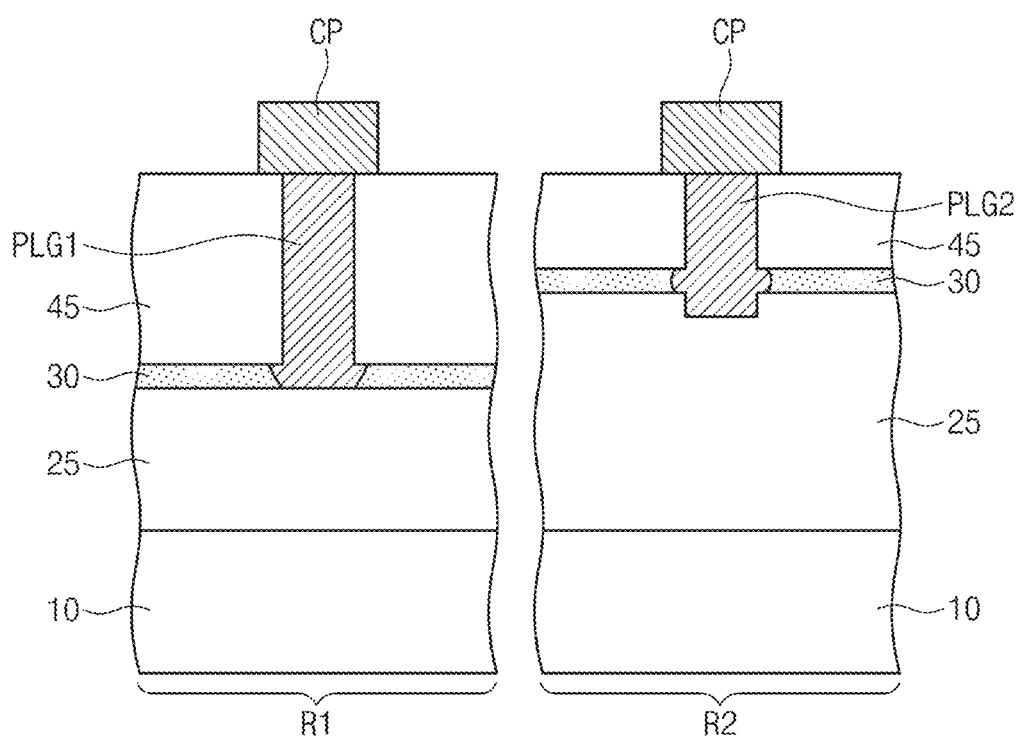

According to the example embodiment illustrated in FIG. 1E, when the second opening OP2 is formed on the second region R2, the top surface of the lower layer 25 may be partially recessed. Accordingly, on the second region R2, the second contact plug PLG2 may have a bottom surface lower than the top surface of the lower layer 25. In such cases, the second contact plug PLG2 may have a maximum width in the etch stop layer 30.

Figure 2:
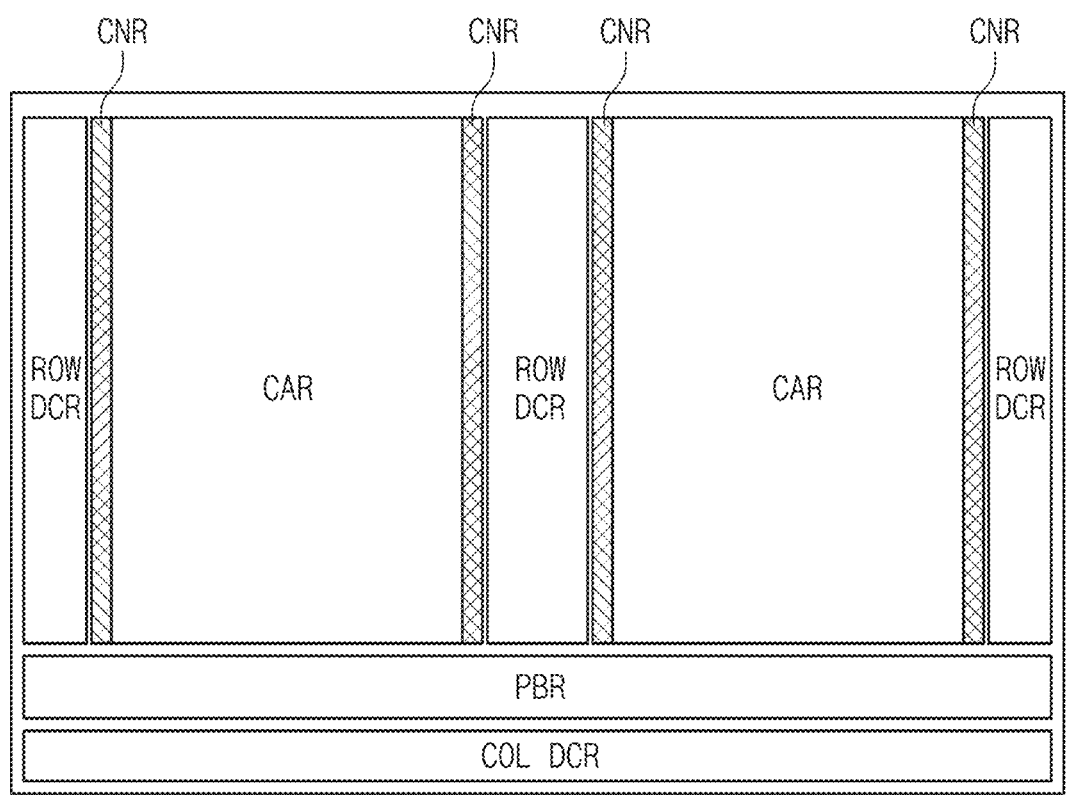
FIG. 2 illustrates a schematic diagram for explaining a simplified configuration of a three-dimensional semiconductor memory device according to an example embodiment of the present inventive concepts.

FIG. 2 illustrates a schematic diagram for explaining a simplified configuration of a three-dimensional semiconductor memory device according to an example embodiment of the present inventive concepts.

Referring to FIG. 2, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region (not shown). In some example embodiments, a connection region CNR may be between the cell array region CAR and the row decoder regions ROW DCR.

The cell array region CAR may include a memory cell array consisting of a plurality of memory cells. In some example embodiments, the memory cell array may include three-dimensionally arranged memory cells, a plurality of word lines electrically connected to the memory cells, and a plurality of bit lines electrically connected to the memory cells.

The row decoder region ROW DCR may include a row decoder that selects the word lines of the memory cell array, and the connection region CNR may be provided with a routing structure that electrically connects the memory cell array and the row decoder to each other. The row decoder may select one of the word lines of the memory cell array in accordance with address information. The row decoder may provide word line voltages to the selected word line and unselected word lines in response to a control signal from a control circuit.

The page buffer region PBR may include a page buffer that reads data stored in the memory cells. Depending on an operating mode, the page buffer may temporarily store data to be stored in the memory cells or sense data stored in the memory cells. The page buffer may function as a write driver circuit in a program operating mode and as a sense amplifier circuit in a read operating mode.

The column decoder region COL DCR may include a column decoder connected to the bit lines of the memory cell array. The column decoder may provide a data transmission path between the page buffer and an external device (e.g., a memory controller).

Figure 3:
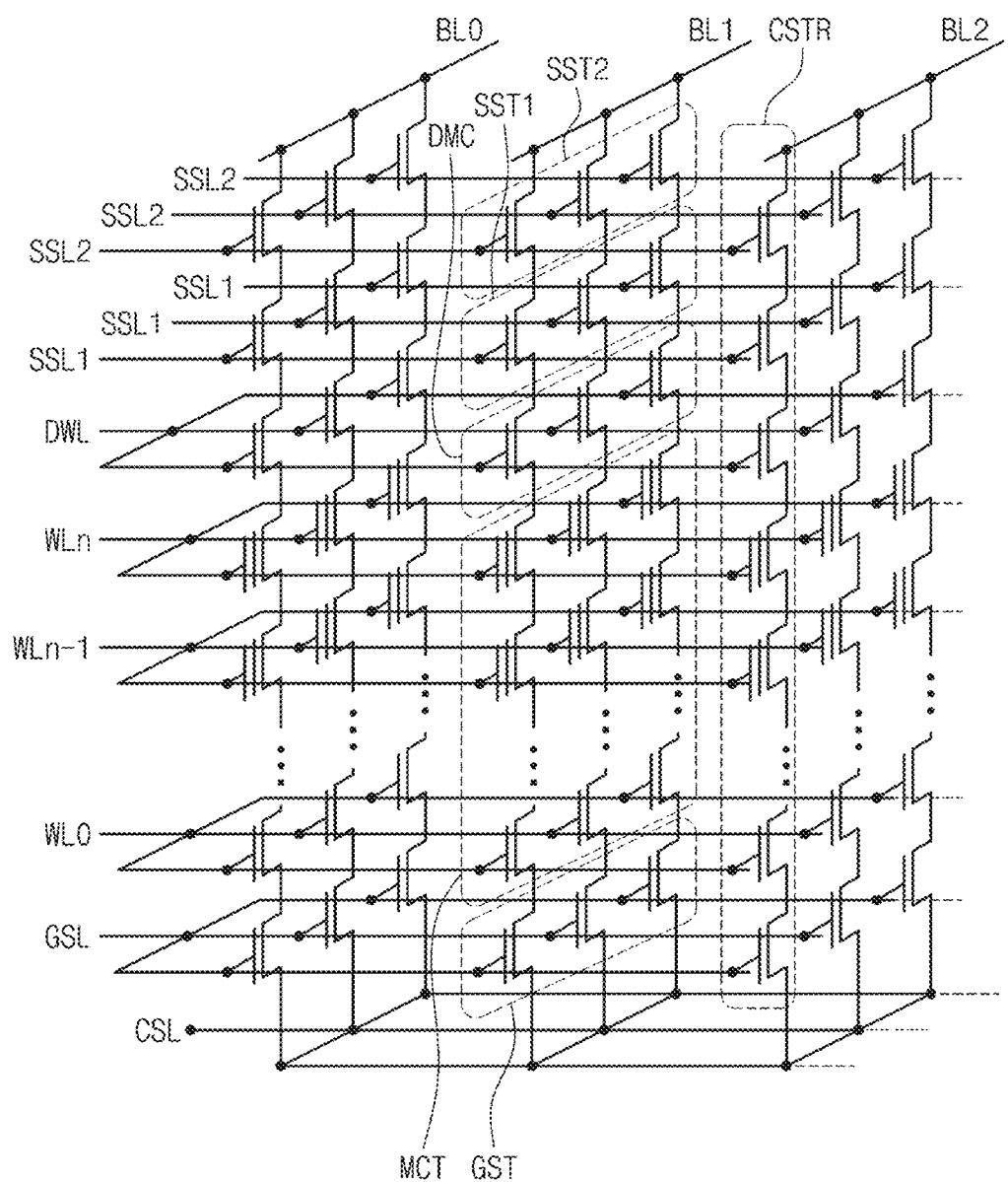
FIG. 3 illustrates a circuit diagram of a three-dimensional semiconductor memory device according to an example embodiment of the present inventive concepts.

FIG. 3 illustrates a circuit diagram of a three-dimensional semiconductor memory device according to an example embodiment of the present inventive concepts.

Referring to FIG. 3, a cell array of a three-dimensional semiconductor memory device may include a common source line CSL, a plurality of bit lines BL0 to BL2, and a plurality of cell strings CSTR between the common source line CSL and the bit lines BL0 to BL2.

The bit lines BL0 to BL2 may be two-dimensionally arranged, and a plurality of cell strings CSTR may be connected in parallel to each of the bit lines BL0 to BL2. A plurality of cell strings CSTR may be commonly connected to the common source line CSL. In this configuration, a plurality of cell strings CSTR may be between a plurality of bit lines BL0 to BL2 and a single common source line CSL. The common source line CSL may be provided in plural, which may be two-dimensionally arranged. The common source lines CSL may be supplied with the same voltage or electrically controlled independently of each other.

In some example embodiments, each of the cell strings CSTR may include string select transistors SST1 and SST2 connected in series, memory cell transistors MCT connected in series, and a ground select transistor GST. Each of the memory cell transistors MCT may include a data storage element.

For example, each of the cell strings CSTR may include first and second string select transistors SST and SST2 connected in series, the second string select transistor SST2 may be coupled to one of the bit lines BL0 to BL2, and the ground select transistor GST may be coupled to the common source line CSL. The memory cell transistors MCT may be connected in series between the first string select transistor SST1 and the ground select transistor GST.

Each of the cell strings CSTR may further include a dummy cell connected between the first string select transistor SST1 and the memory cell transistor MCT. Although not shown in figures, the dummy cell may also be connected between the ground select transistor GST and the memory cell transistor MCT.

In some example embodiments, in each of the cell strings CSTR, the ground select transistor GST may include a plurality of MOS transistors connected in series similar to the first and second string select transistors SST1 and SST2. In some example embodiments, each of the cell strings CSTR may include a single string select transistor.

The first string select transistor SST1 may be controlled by a first string select line SSL1, and the second string select transistor SST2 may be controlled by a second string select line SSL2. The memory cell transistors MCT may be controlled by a plurality of word lines WL0 to WLn, and the dummy cells may be controlled by a dummy word line DWL. The ground select transistor GST may be controlled by a ground select line GSL. The common source line CSL may be connected in common to sources of the ground select transistors GST.

Because one cell string CSTR includes a plurality of the memory cell transistors MCT that are disposed at different distances from the common source line CSL, the word lines WL0 to WLn and DWL may be between the common source line CSL and the bit lines BL0 to BL2.

The memory cell transistors MCT may include gate electrodes, which are spaced apart at substantially the same distance from the common source lines CSL, connected in common to one of the word lines WL0 to WLn and DWL to have an equipotential state. The gate electrodes disposed at different rows or columns may be controlled independently from each other.

Figure 4:
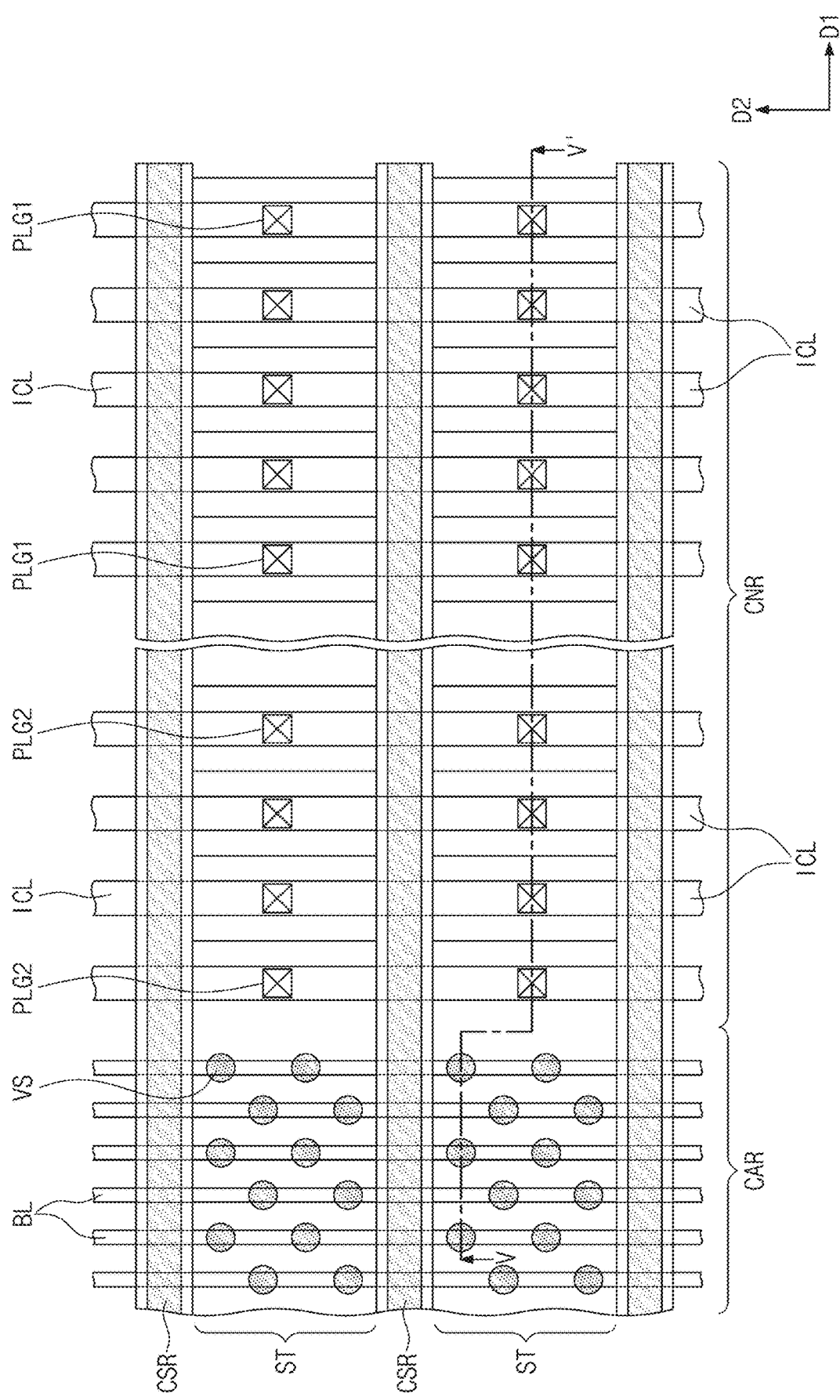
FIG. 4 illustrates a plan view of a three-dimensional semiconductor memory device according to an example embodiment of the present inventive concepts.
Figure 5:
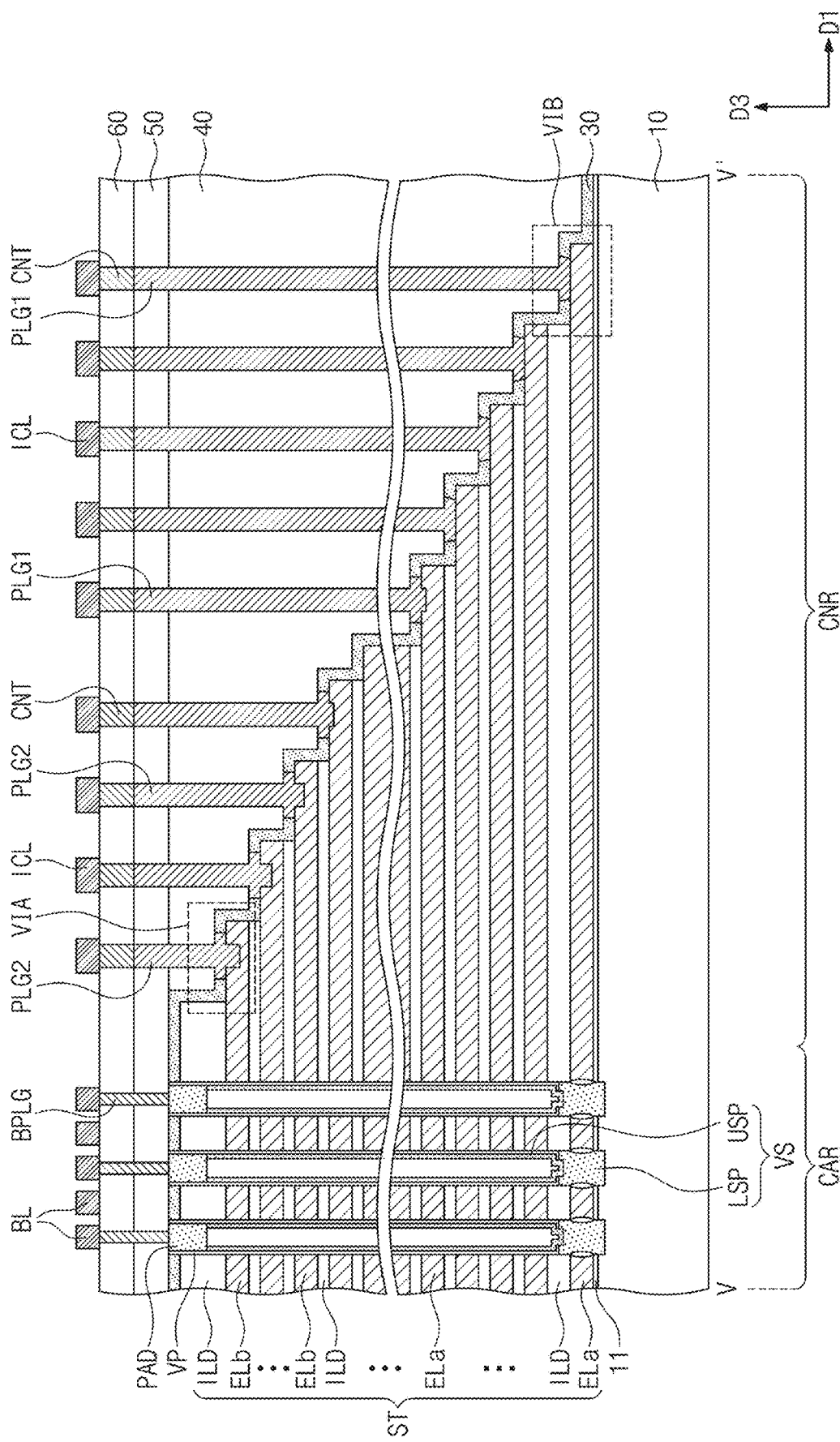
FIG. 5 illustrates a cross-sectional view taken along line V-V' of FIG. 4, showing a three-dimensional semiconductor memory device according to an example embodiment of the present inventive concepts.
Figure 6A:
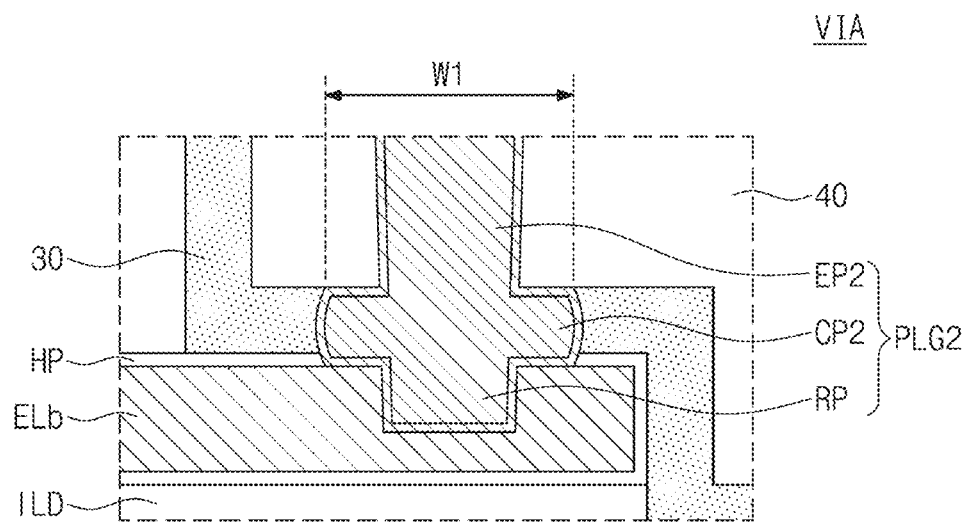
FIG. 6A illustrates an enlarged view of section VIA of FIG. 5.
Figure 6B:
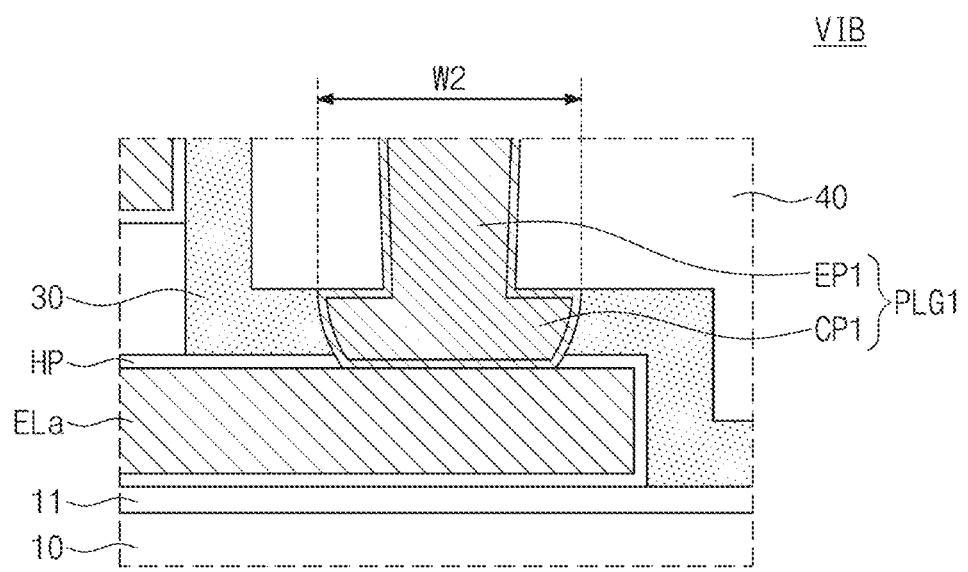
FIGS. 6B and 6C illustrate enlarged views of section VIB of FIG. 5.
Figure 6C:
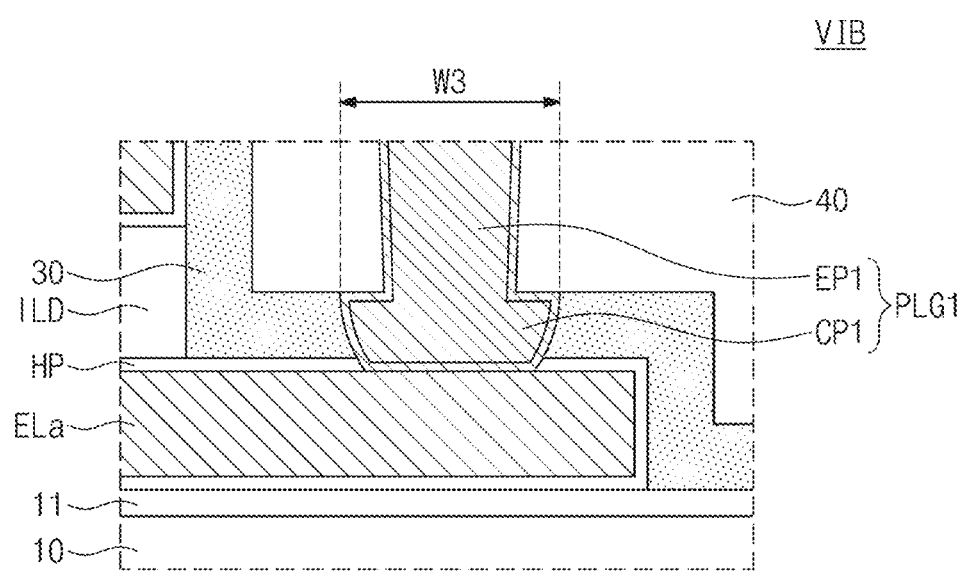

FIG. 4 illustrates a plan view of a three-dimensional semiconductor memory device according to an example embodiment of the present inventive concepts. FIG. 5 illustrates a cross-sectional view taken along line V-V' of FIG. 4, showing a three-dimensional semiconductor memory device according to an example embodiment of the present inventive concepts. FIG. 6A illustrates an enlarged view of section VIA of FIG. 5, and FIGS. 6B and 6C illustrate enlarged views of section VIB of FIG. 5.

Referring to FIGS. 4 and 5, a substrate 10 may include a cell array region CAR and a connection region CNR. The connection region CNR may be adjacent to the cell array region CAR in a first direction D1. The substrate 10 may be one of a material (e.g., silicon) having semiconductor characteristics, an insulating material (e.g., glass), or a semiconductor or conductor covered with an insulating material. For example, the substrate 10 may be a silicon wafer having a first conductive type.

A plurality of electrode structures ST may extend along the first direction D1 from the cell array region CAR toward the connection region CNR, and may be spaced apart from each other in a second direction D2. A buffer insulation layer 11 may be interposed between the electrode structures ST and the substrate 10, and may include a silicon oxide layer.

The substrate 10 may be provided therein with common source regions CSR between the electrode structures ST adjacent to each other. The common source regions CSR may extend in parallel to the electrode structures ST in the first direction D1. The common source regions CSR may be formed by doping the substrate 10 with a second conductive type impurity. The common source regions CSR may include, for example, an N-type impurity (e.g., arsenic (As) or phosphorous (P)).

Each of the electrode structures ST may include electrodes ELa and ELb and insulation layers ILD that are alternately and repeatedly stacked along a third direction D3 perpendicular to a top surface of the substrate 10. The electrodes ELa and ELb may have substantially the same thickness, and thicknesses of the insulation layers ILD may be different depending on characteristics of a semiconductor memory device. Each thickness of the insulation layers ILD may be smaller than each thickness of the electrodes ELa and ELb. The electrodes ELa and ELb may include, for example, at least one selected from doped semiconductor (e.g., doped silicon, etc.), metal (e.g., tungsten, copper, aluminum, etc.), conductive metal nitride (e.g., titanium nitride, tantalum nitride, etc.), or transition metal (e.g., titanium, tantalum, etc.). The insulation layer ILD may include, for example, a silicon oxide layer.

In some example embodiments, the electrode structure ST may include a lower structure and an upper structure on the lower structure. The lower structure may include a plurality of first electrodes ELa and insulation layers ILD that are alternately stacked on the substrate 10, and the upper structure may include a plurality of second electrodes ELb and insulation layers ILD that are alternatively stacked on the lower structure.

The electrode structure ST may have a stepwise structure on the connection region CTR. For example, the first and second electrodes ELa and ELb may have their lengths in the first direction D1 that decrease with increasing distance from the substrate 10 in the first direction D1, and the electrode structures ST may have their heights that decrease with increasing distance from the cell array region CAR in the first direction D1. Sidewalls of the first and second electrodes ELa and ELb on the connection region CNR may be spaced apart at, for example, a regular distance along the first direction D1.

Each of the first and second electrodes ELa and ELb may have a pad portion on the connection region CNR, and the pad portions of the first and second electrodes ELa and ELb may be horizontally and vertically located at different positions. In some example embodiments, on the connection region CNR, each pad portion of the first and second electrodes ELa and ELb may be exposed by one of the insulation layers ILD disposed immediately thereon. For example, each of the first and second electrodes ELa and ELb may have a length greater than a length of one of the insulation layers ILD disposed immediately thereon in the first direction D1.

Each of the first and second electrodes ELa and ELb may extend from the cell array region CAR toward the connection region CNR, while having a substantially uniform thickness. The first and second electrodes ELa and ELb may have top surfaces under the bottom surfaces of insulation layers ILD disposed immediately thereon, respectively.

In some example embodiments, a three-dimensional semiconductor memory device may be a vertical NAND Flash memory device, and in this case the first and second electrodes ELa and ELb of the electrode structure ST may serve as control gates of memory cell transistors (see MCT of FIG. 2). For example, the first and second electrodes ELa and ELb may be used as the ground select line GSL, the word lines WL0 to WLn and DWL, and/or string select lines SSL1 and SSL2 discussed with reference to FIG. 3.

A plurality of vertical structures VS may be disposed to penetrate the electrode structures ST on the substrate 10 of the cell array region CAR. For example, the vertical structures VS may include a semiconductor material such as silicon (Si), germanium (Ge), or a mixture thereof. In some example embodiments, the vertical structures VS may include an impurity-doped semiconductor or an undoped intrinsic semiconductor.

The vertical structures VS may be provided with bit line pads PAD at or on upper ends thereof, and coupled to bit line contact plugs BPLG via the bit line pads PAD. The vertical structures VS may serve as channels of the select transistors and the memory cell transistors discussed with reference to FIG. 2.

For example, each of the vertical structures VS may include a lower semiconductor pattern LSP and an upper semiconductor pattern USP. The lower semiconductor pattern LSP may be in direct contact with the substrate 10, and may include a pillar-shaped epitaxial layer grown from the substrate 10. The upper semiconductor pattern USP may be in direct contact with the lower semiconductor pattern LSP and may have a "U" shape or a pipe shape with a closed bottom end. An inside of the upper semiconductor pattern USP may be filled with air or an insulating material. The upper semiconductor pattern USP may have a different crystal structure from that of the lower semiconductor pattern LSP. For example, the upper semiconductor pattern USP may have at least one selected from a single crystalline structure, an amorphous structure, or a polycrystalline structure.

A vertical insulation pattern VP may be between the electrode structures ST and the vertical structures VS. The vertical insulation pattern VP may extend in the third direction D3 and surround sidewalls of the vertical structures VS. The vertical insulation pattern VP may include a single thin layer or a plurality of thin layers. In some example embodiments, the vertical insulation pattern VP may include a charge storage layer used as a memory element of an NAND Flash memory device. In some example embodiments, the vertical insulation pattern VP may include a thin layer for a phase change memory device or variable resistance memory device. For example, the vertical insulation pattern VP may include a charge storage layer and a tunnel insulation layer as components of a memory element of an NAND Flash memory device. In some example embodiments, the vertical insulation pattern VP may include a blocking insulation layer, a charge storage layer, and a tunnel insulation layer as components of a memory element of an NAND Flash memory device.

A horizontal insulation pattern HP may extend onto top and bottom surfaces of the first and second electrodes ELa and ELb from between the vertical insulation pattern VP and sidewalls of the first and second electrodes ELa and ELb. The horizontal insulation pattern HP may include a charge storage layer and a tunnel insulation layer as components of a memory element of an NAND Flash memory device. In some example embodiments, the horizontal insulation pattern HP may include a blocking insulation layer. In some example embodiments, the horizontal insulation pattern HP may horizontally extend from the cell array region CAR toward the connection region CNR. In this configuration, as shown in FIGS. 6A and 6B, a portion of the horizontal insulation pattern HP may be between an etch stop layer 30 and each of the top surfaces of the first and second electrodes ELa and ELb.

In some example embodiments, the etch stop layer 30 and a planarized insulation layer 40 may be sequentially stacked on an entire surface of the substrate 10 on which the electrode structures ST are disposed. The etch stop layer 30 may be interposed between the planarized insulation layer 40 and the electrode structures ST, and may have a substantially uniform thickness. For example, the etch stop layer 30 may conformally cover a surface of the stepwise structure of the electrode structure ST. In this configuration, on the connection region CNR, the etch stop layer 30 may cover the top surfaces of the first and second electrodes ELa and ELb.

The etch stop layer 30 may include a material having an etch selectivity with respect to the planarized insulation layer 40, the insulation layers ILD, and the first and second electrodes ELa and ELb of the electrode structure ST. In some example embodiments, the etch stop layer 30 may be an amorphous boron layer, or an insulating material having a desired etch selectivity, as discussed with reference to FIGS. 1A to 1E. As discussed above, the amorphous boron layer may contain about 90 to 100 atomic percent of boron. The amorphous boron layer may have the desired etch selectivity with respect to, for example, a silicon nitride layer, a silicon oxide layer, and/or a metallic material.

The etch stop layer 30 may be, as shown in FIGS. 6A and 6B, in direct contact with a portion of the horizontal insulation pattern HP covering each top surface of the first and second electrodes ELa and ELb on the connection region CNR.

The planarized insulation layer 40 may cover the electrode structures ST on the connection region CNR, and may have a substantially flat top surface. The planarized insulation layer 40 may include an insulating material having an etch selectivity with respect to the etch stop layer 30, and may consist of a single insulation layer or a plurality of stacked insulation layers. A first interlayer dielectric layer 50 may be provided on the planarized insulation layer 40 to cover top surfaces of the vertical structures VS. The planarized insulation layer 40 and the first interlayer dielectric layer 50 may include, for example, high density plasma (HDP) oxide, TEOS (tetraethylorthosilicate), PE-TEOS (plasma enhanced tetraethylorthosilicate), $O_3$-TEOS ($O_3$-tetratthylorthosilicate), USG (undoped silicate glass), PSG (phosphosilicate glass), BSG (borosilicate glass), BPSG (borophosphosilicate glass), FSG (fluorosilicate glass), SOG (spin on glass), TOSZ (tonen silazene), or a combination thereof.

In some example embodiments, on the connection region CNR, the pad portions of the first and second electrodes ELa and ELb may be coupled to contact plugs PLG1 and PLG2 that penetrate the first interlayer dielectric layer 50, the planarized insulation layer 40, and the etch stop layer 30. The contact plugs PLG1 and PLG2 may be spaced apart from sidewalls of the insulation layers ILD.

The contact plugs PLG1 and PLG2 may have top surfaces at substantially the same height from the top surface of the substrate 10. For example, the top surfaces of the contact plugs PLG1 and PLG2 may be substantially coplanar with a top surface of the first interlayer dielectric layer 50. The contact plugs PLG1 and PLG2 may have lengths in the third direction D3 that decrease toward the cell array region CAR. Each of the contact plugs PLG1 and PLG2 may include a barrier metal layer consisting of metal nitride (e.g., TiN, TaN, or WN) or a metal layer (e.g., Ti, Ta, Co, or Cu).

In some example embodiments, the first contact plugs PLG1 may be coupled to corresponding first electrode ELa of the electrode structure ST, and the second contact plugs PLG2 may be coupled to corresponding second electrodes ELb of the electrode structure ST.

The second contact plug PLG2 coupled to an uppermost second electrode ELb may have a bottom surface between top and bottom surfaces of the uppermost second electrode ELb. The first contact plug PLG1 coupled to a lowermost first electrode ELa may have a bottom surface at substantially the same level as that of a top surface of the lowermost first electrode ELa. The first and second contact plugs PLG1 and PLG2 may have bottom surfaces, whose positions from top surfaces of corresponding first and second electrodes ELa and ELb are different from each other.

The first contact plug PLG1 may include, as shown in FIG. 6B, an extended portion EP1 extending in the third direction D3 and a contacted portion CP1 protruding horizontally from the extended portion EP1. Likewise, the second contact plug PLG2 may include, as shown in FIG. 6A, an extended portion EP2 extending in the third direction D3 and a contacted portion CP2 protruding horizontally from the extended portion EP2.

The extended portions EP1 and EP2 of the first and second contact plugs PLG1 and PLG2 may penetrate the first interlayer dielectric layer 50 and the planarized insulation layer 40. The extended portions EP1 and EP2 of the first and second contact plugs PLG1 and PLG2 may have their lengths in the third direction D3 that decrease as the first and second contact plugs PLG1 and PLG2 approach the cell array region CAR. The contacted portions CP1 and CP2 of the first and second contact plugs PLG1 and PLG2 may penetrate the etch stop layer 30 and may be in direct contact with corresponding first and second electrodes ELa and ELb. The contacted portions CP1 and CP2 of the first and second contact plugs PLG1 and PLG2 may penetrate the horizontal insulation pattern HP. In each of the first and second contact plugs PLG1 and PLG2, a width of the contacted portion CP1 or CP2 may be greater than a width of the extended portion EP1 or EP2. The first and second contact plugs PLG1 and PLG2 may have respective maximum widths at the contacted portions CP1 and CP2, respectively.

In some example embodiments, the contacted portions CP1 and CP2 of the first and second contact plugs PLG1 and PLG2 may have different shapes from each other. For example, the contacted portions CP1 and CP2 of the first and second contact plugs PLG1 and PLG2 may have different sidewall profiles from each other. For example, the contacted portion CP1 of the first contact plug PLG1 may have an inclined sidewall, and the contacted portion CP2 of the second contact plug PLG2 may have a rounded sidewall, but the present inventive concepts are not limited thereto.

The second contact plug PLG2 may further include a recessed portion RP extending below the top surface of the second electrode ELb from the contacted portion CP2. The recessed portion RP may have a width less than a minimum width of the contacted portion CP2. At least one of the first contact plugs PLG1 may further include a recessed portion extending below the top surface of the first electrode ELa.

Referring to FIGS. 6A and 6B, the contacted portion CP1 of the first contact plug PLG1 may have a maximum width W2, which is substantially the same as a maximum width W1 of the contacted portion CP2 of the second contact plug PLG2. The contacted portion CP1 of the first contact plug PLG1 may have a bottom width, which is smaller than a bottom width of the contacted portion CP2 of the second contact plug PLG2. In some example embodiments, referring to FIGS. 6A and 6C, the contacted portion CP1 of the first contact plug PLG1 may have a maximum width W3 smaller than the maximum width W1 of the contacted portion CP2 of the second contact plug PLG2.

A second interlayer dielectric layer 60 the first interlayer dielectric layer 50 to cover top surfaces of the first and second contact plugs PLG1 and PLG2. Bit lines BL that cross over the electrode structures ST and extend in the second direction D2 may be provided on the second interlayer dielectric layer 60 of the cell array region CAR. Each of the bit lines BL may be coupled through the bit line contact plug BPLG to the bit line pad PAD.

Further, interconnection lines ICL may be provided on the second interlayer dielectric layer 60 of the connection region CNR extending in the second direction D2. The interconnection lines ICL may be connected to the contact plugs PLG1 and PLG2 via interconnection contact plugs CNT.

Figure 7:
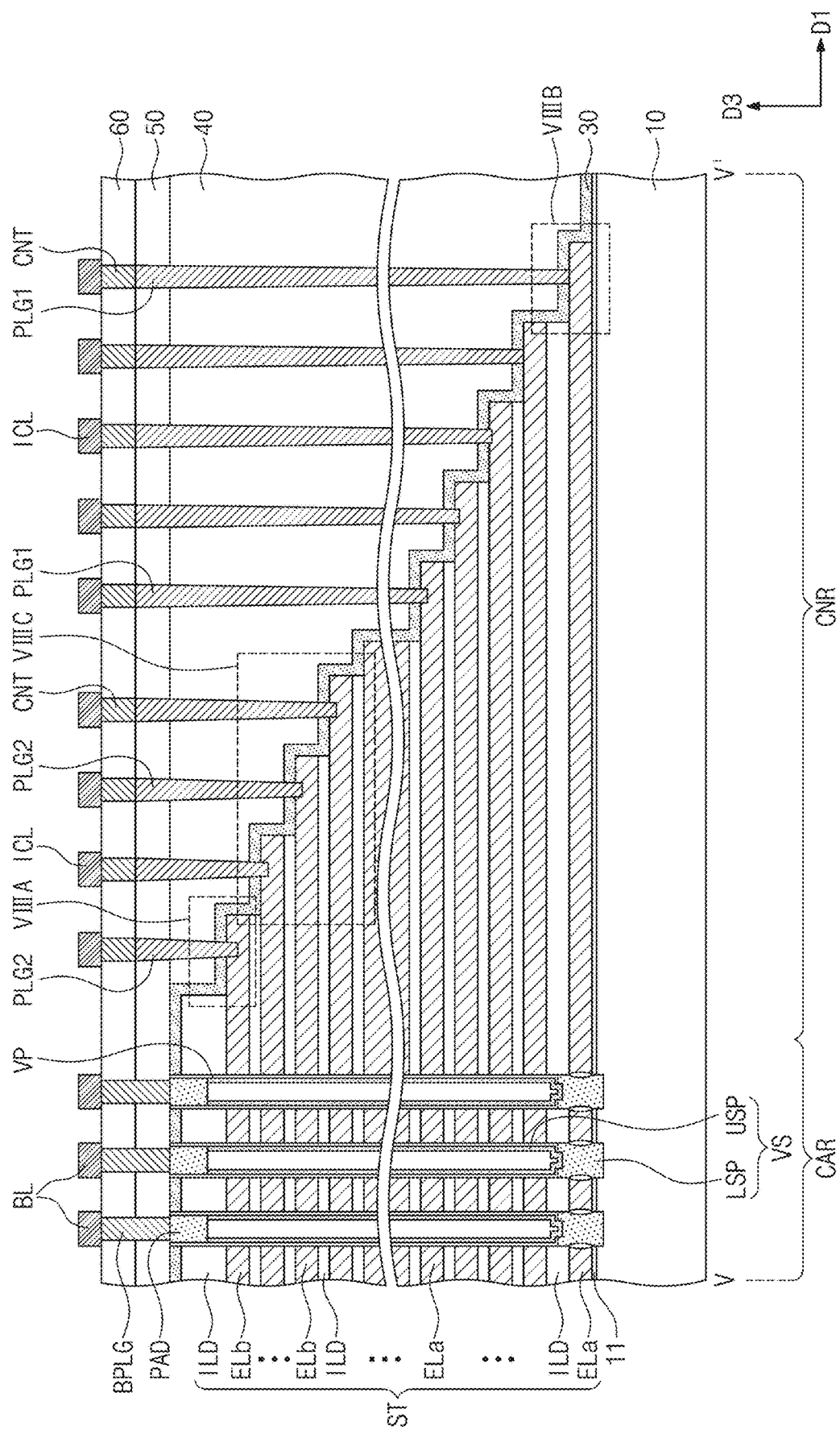
FIG. 7 illustrates a cross-sectional view of a three-dimensional semiconductor memory device according to an example embodiment of the present inventive concepts.
Figure 8A:
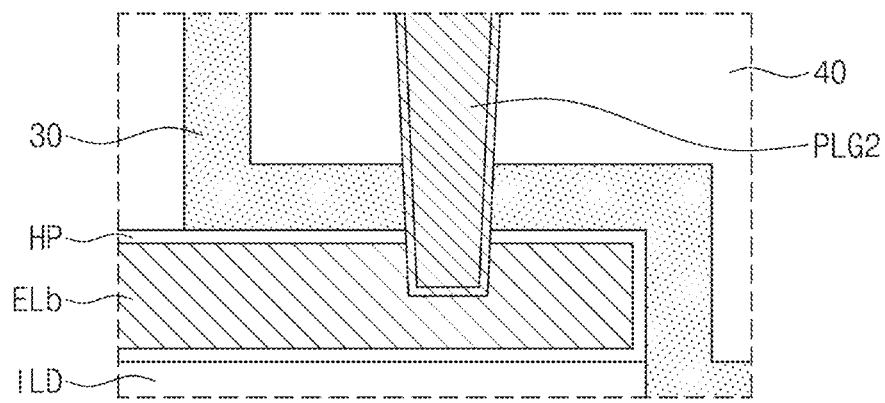
FIGS. 8A and 8B illustrate enlarged views of sections VIIIA and VIIIB of FIG. 7, respectively.
Figure 8B:
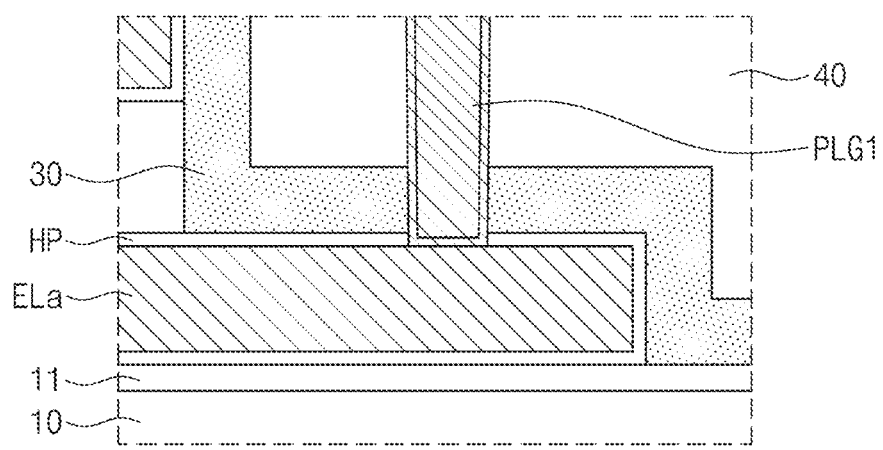
Figure 8C:
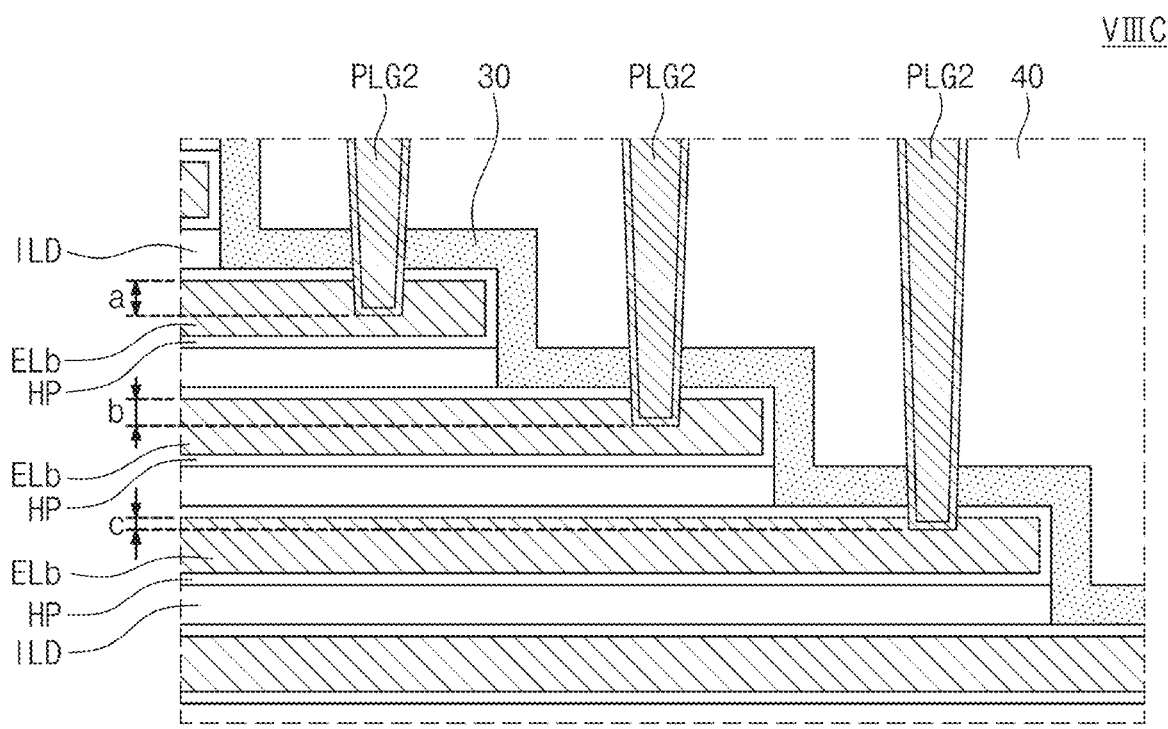
FIG. 8C illustrates an enlarged view of section VIIIC shown in FIG. 7.
Figure 9A:
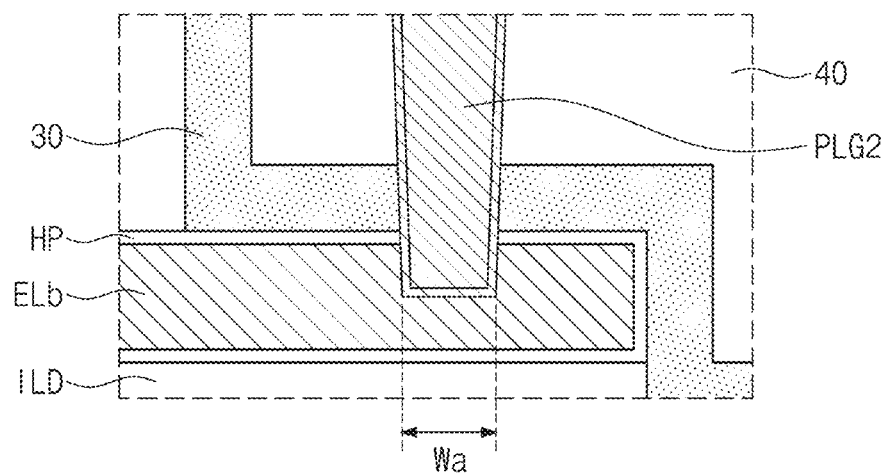
FIGS. 9A and 9B illustrate enlarged views of sections VIIIA and VIIIB of FIG. 7, respectively, showing other examples of a three-dimensional semiconductor memory device according to an example embodiment of the present inventive concepts.
Figure 9B:
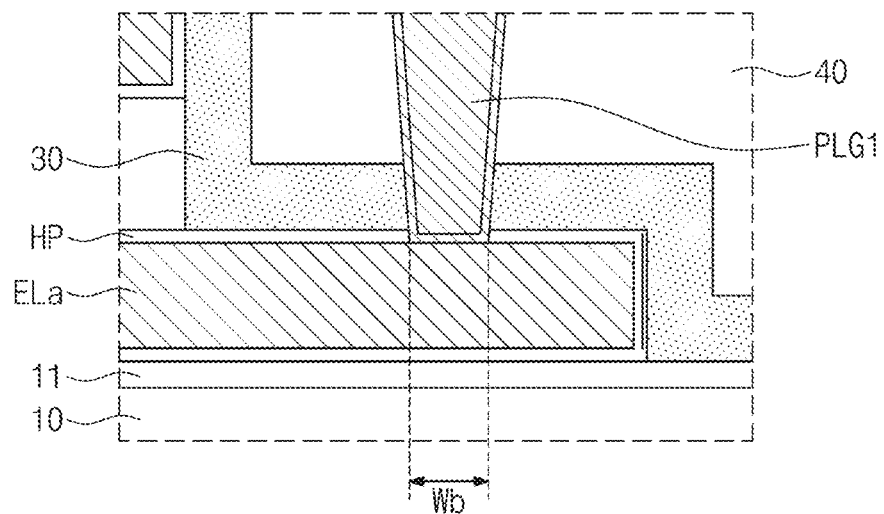

FIG. 7 illustrates a cross-sectional view of a three-dimensional semiconductor memory device according to an example embodiment of the present inventive concepts. FIGS. 8A and 8B illustrate enlarged views of sections VIIIA and VIIIB of FIG. 7, respectively, and FIG. 8C illustrates an enlarged view of section VIIIC of FIG. 7. FIGS. 9A and 9B illustrate enlarged views of sections VIIIA and VIIIB of FIG. 7, respectively, showing other examples of a three-dimensional semiconductor memory device according to an example embodiment of the present inventive concepts. For brevity of the description, omission will be made in explaining and illustrating technical features the same as those of the three-dimensional semiconductor device discussed above.

Referring to FIGS. 7, 8A, and 8B, the first and second electrodes ELa and ELb of the electrode structure ST may be connected to the first and second contact plugs PLG1 and PLG2, respectively, penetrating the first interlayer dielectric layer 50, the planarized insulation layer 40, and the etch stop layer 30.

In some example embodiments, the contact plugs PLG1 and PLG2 may have maximum widths at respective top surfaces thereof and minimum widths at respective bottom surfaces thereof. The contact plugs PLG1 and PLG2 may have bottom surfaces, whose positions from top surfaces of corresponding first and second electrodes ELa and ELb are different from each other. For example, referring to FIG. 8C, as a height of the electrodes ELa and ELb from the top surface of the substrate 10 increases, distances a, b, and c between the bottom surfaces of the contact plugs PLG1 and PLG2 and the top surfaces of the corresponding electrodes ELa and ELb may increase.

The second contact plug PLG2 coupled to an uppermost second electrode ELb may have a bottom surface between top and bottom surfaces of the uppermost second electrode ELb. The first contact plug PLG1 coupled to a lowermost first electrode ELa may have a bottom surface at substantially the same level as that of a top surface of the lowermost first electrode ELa.

Referring to FIGS. 9A and 9B, the first contact plug PLG1 coupled to the lowermost first electrode ELa may have a minimum width Wb less than a minimum width Wa of the second contact plug PLG2 coupled to the uppermost second electrode ELb. For example, a contact area between the first electrode ELa and the first contact plug PLG1 may be less than a contact area between the second electrode ELb and the second contact plug PLG2.

Figure 10:
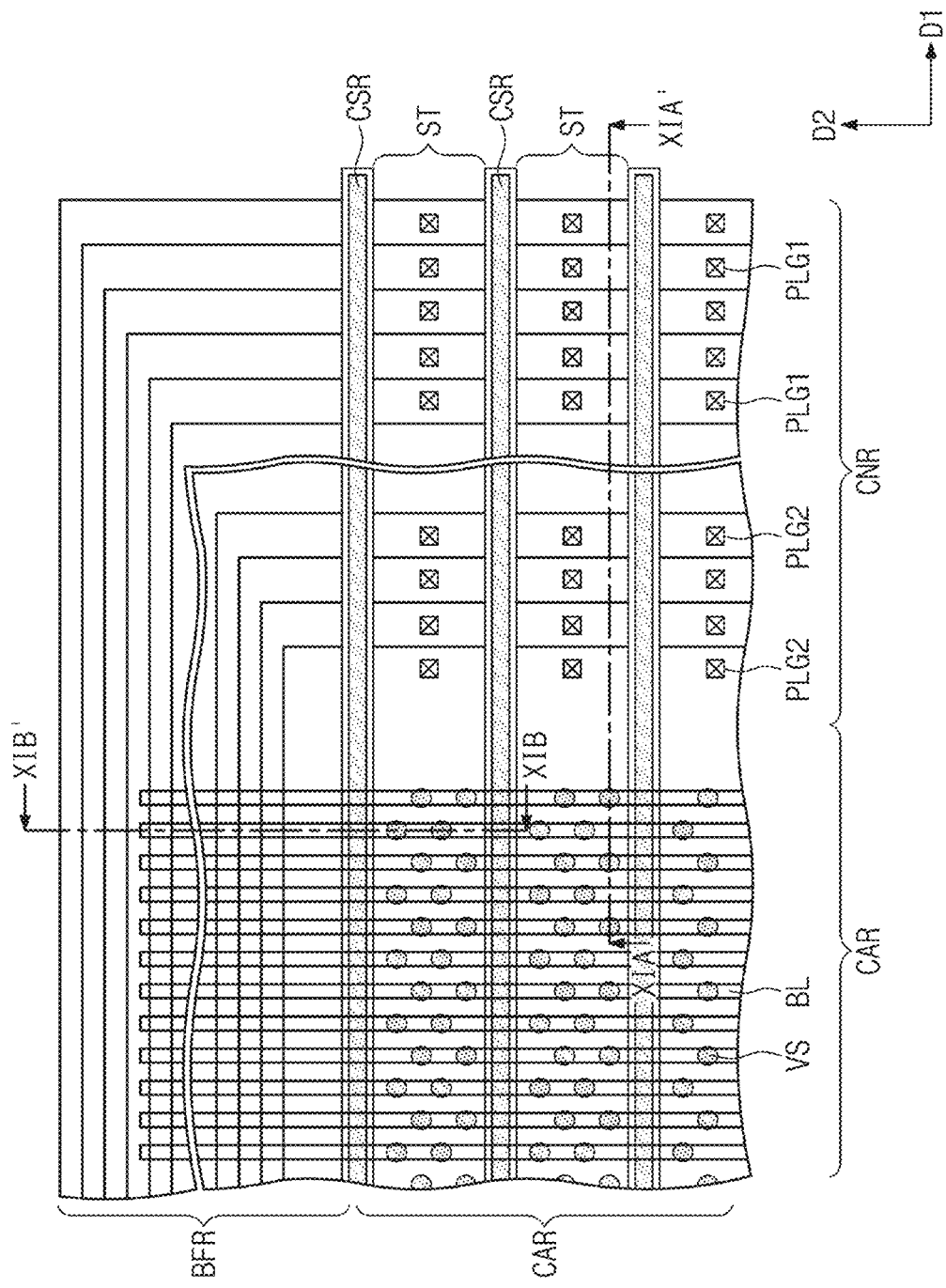
FIG. 10 illustrates a plan view of a three-dimensional semiconductor memory device according to an example embodiment of the present inventive concepts.
Figure 11A:
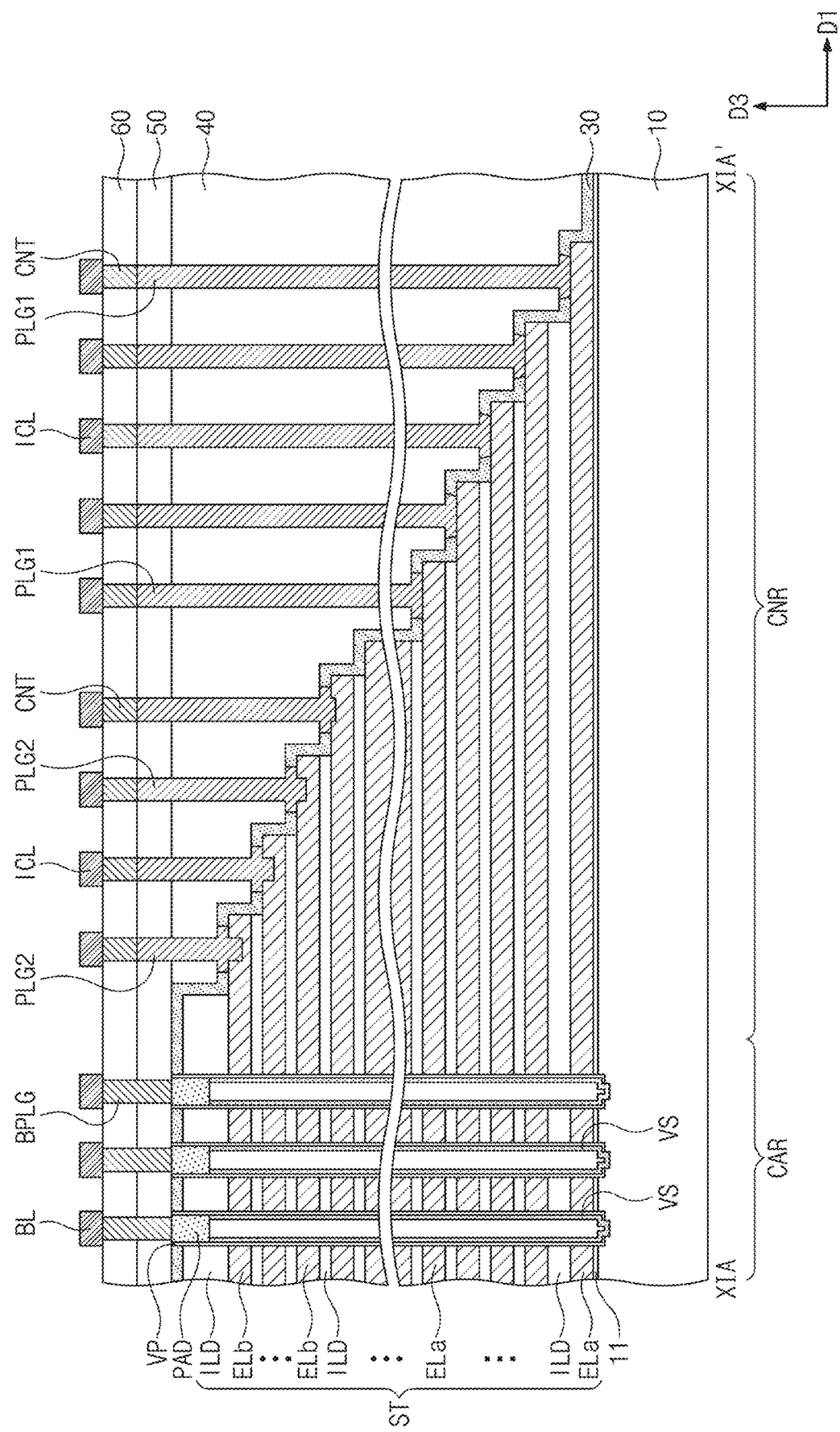
FIGS. 11A and 11B illustrate cross sectional views respectively taken along lines XIA-XIA' and XIB-XIB' of FIG. 10, showing a three-dimensional semiconductor memory device according to an example embodiment of the present inventive concepts.
Figure 11B:
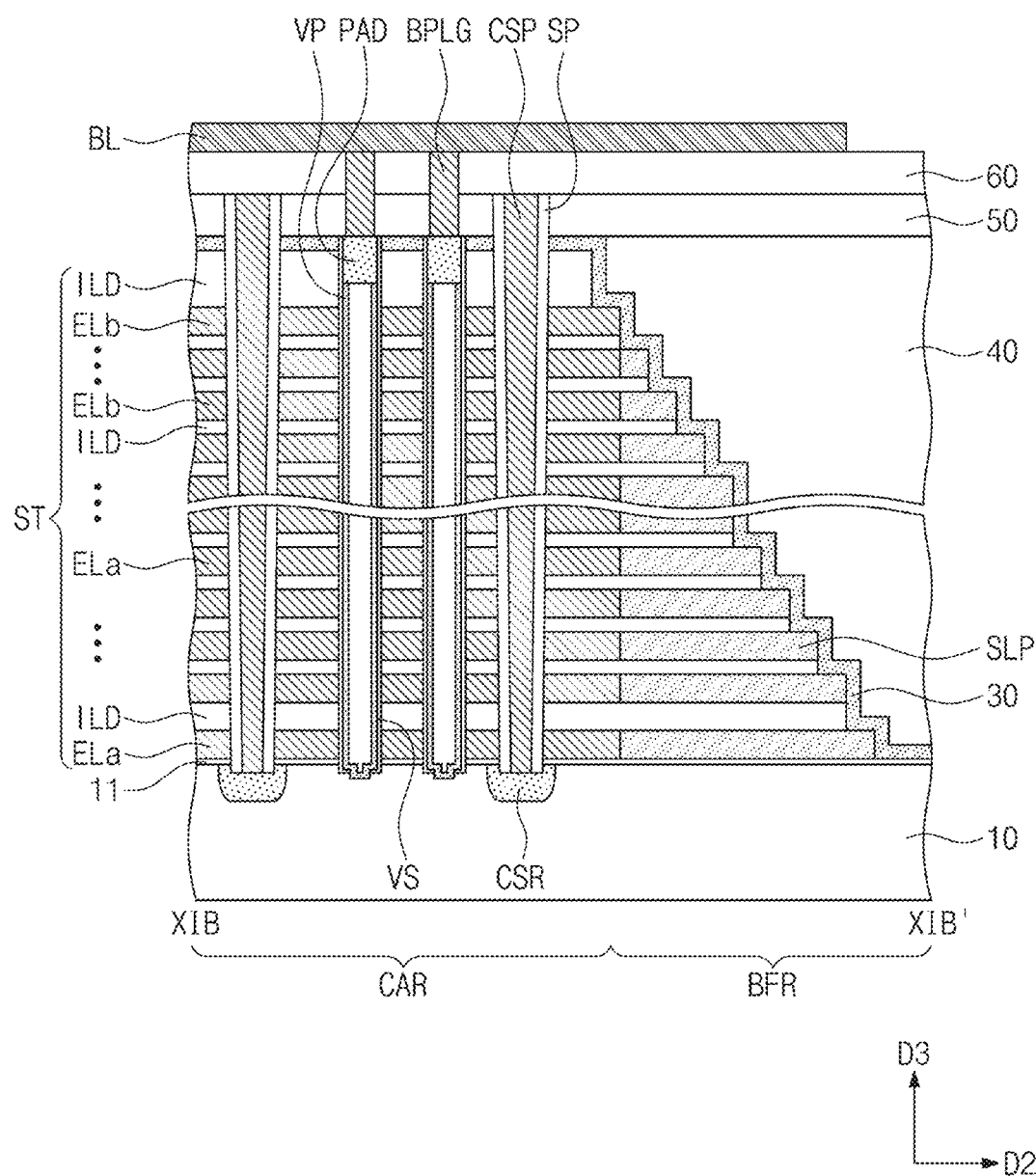

FIG. 10 illustrates a plan view of a three-dimensional semiconductor memory device according to an example embodiment of the present inventive concepts. FIGS. 11A and 11B illustrate cross sectional views respectively taken along lines XIA-XIA' and XIB-XIB' of FIG. 10, showing a three-dimensional semiconductor memory device according to an example embodiment of the present inventive concepts. For brevity of the description, omission will be made in explaining and illustrating technical features the same as those of the three-dimensional semiconductor device discussed above.

Referring to FIGS. 10, 11A, and 11B, a substrate 10 may include a cell array region CAR, a connection region CNR, and a buffer region BFR. The connection region CNR may be adjacent to the cell array region CAR in a first direction D1, and the buffer region BFR may be adjacent to the cell array region CAR in a second direction D2 crossing the first direction D1.

Electrode structures ST may be provided on the substrate 10, extend in the first direction D1 and are spaced apart from each other in the second direction D2. As discussed above, the electrode structures ST may include first and second electrodes ELa and ELb stacked in a third direction D3. The electrode structures ST may each have a first stepwise structure on the connection region CNR and a second stepwise structure on the buffer region BFR. The second stepwise structure may be the same as or different from the first stepwise structure. In some example embodiments, the first stepwise structure may be inclined more gradually than the second stepwise structure.

On the buffer region BFR, each of the first and second electrodes ELa and ELb of the electrode structure ST may have lengths in the first and second directions D1 and D2 that decrease with increasing distance from a top surface of the substrate 10. For example, the first and second electrodes ELa and ELb may have their lengths that decrease with increasing vertical heights at which the first and second electrodes ELa and ELb are placed. For example, each of the first and second electrodes ELa and ELb of the electrode structure ST on the buffer region BFR may have a first sidewall on the connection region CNR and a second sidewall on the buffer region BFR. For example, the second sidewalls of the first and second electrodes ELa and ELb may be spaced apart on the buffer region BFR at a second distance, and the first sidewalls of the first and second electrodes ELa and ELb may be spaced apart on the connection region CNR at a first distance greater than the second distance.

The electrode structure ST on the buffer region BFR may include sacrificial insulation patterns SLP. The sacrificial insulation patterns SLP may include insulating materials different from those of insulation layers ILD constituting the electrode structure ST. The sacrificial insulation patterns SLP may be portions of sacrificial layers used for forming the electrode structure ST, and may include, for example, silicon nitride.

The sacrificial insulation patterns SLP may be between the insulation layers ILD, which are vertically adjacent to each other on the buffer region BFR, and may be horizontally adjacent to the first and second electrodes ELa and ELb. A horizontal insulation pattern HP may be provided between the sacrificial insulation patterns SLP and the first and second electrodes ELa and ELb.

In some example embodiments, the sacrificial insulation patterns SLP may be in direct contact with an etch stop layer 30. The etch stop layer 30 may include the amorphous boron layer discussed with reference to FIGS. 1A to 1E, and have an etch selectivity with respect to the first and second electrodes ELa and ELb, the insulation layers ILD, and the sacrificial insulation patterns SLP.

According to the example embodiment illustrated in FIGS. 10, 11A, and 11B, each of vertical structures VS may include a semiconductor pattern extending along the third direction D3. The semiconductor pattern may be in direct contact with the substrate 10, and may have a cup or "U" shape. An insulating material may fill an inside of the semiconductor pattern having the aforementioned shape.

Figure 12:
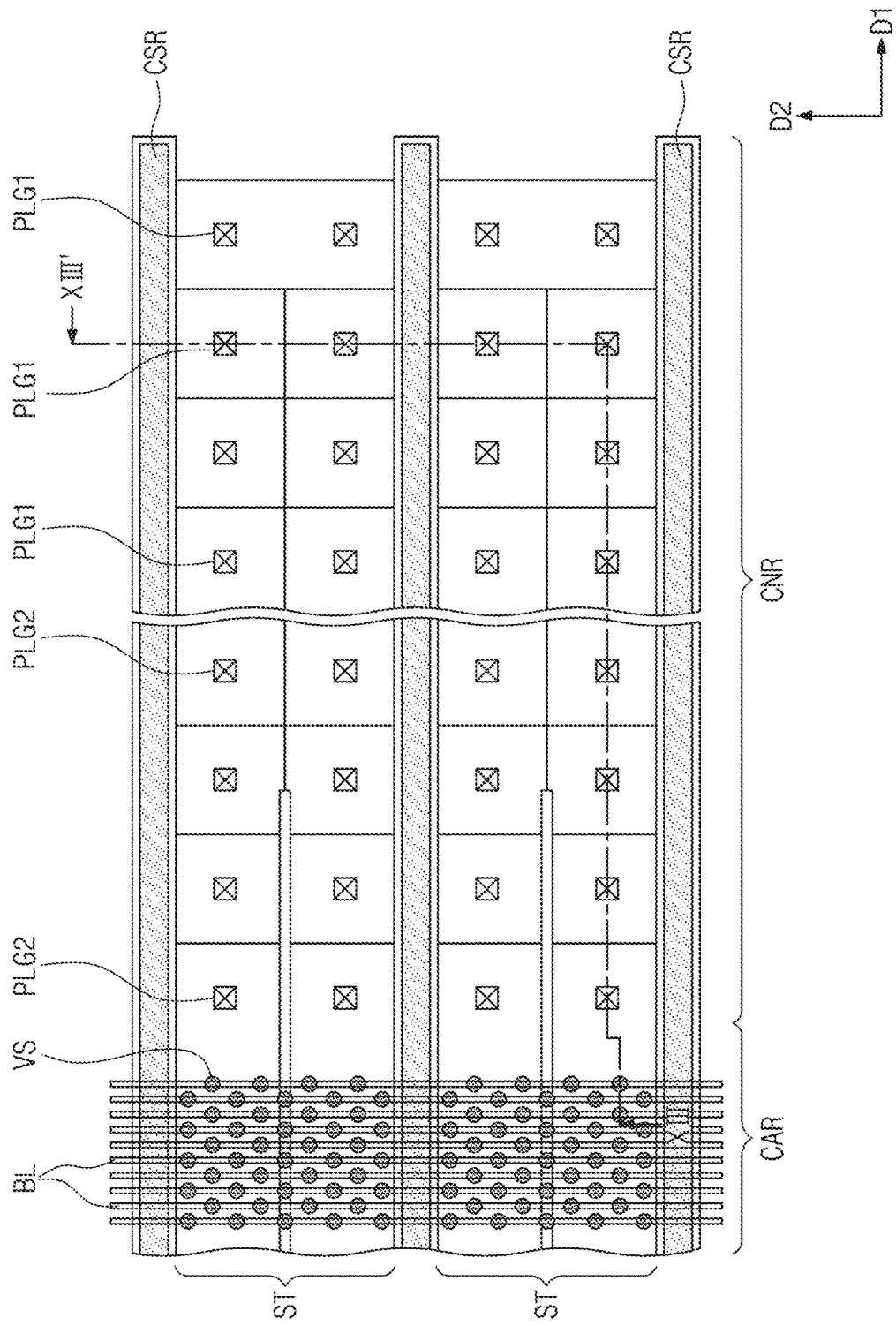
FIG. 12 illustrates a plan view of a three-dimensional semiconductor memory device according to an example embodiment of the present inventive concepts.
Figure 13:
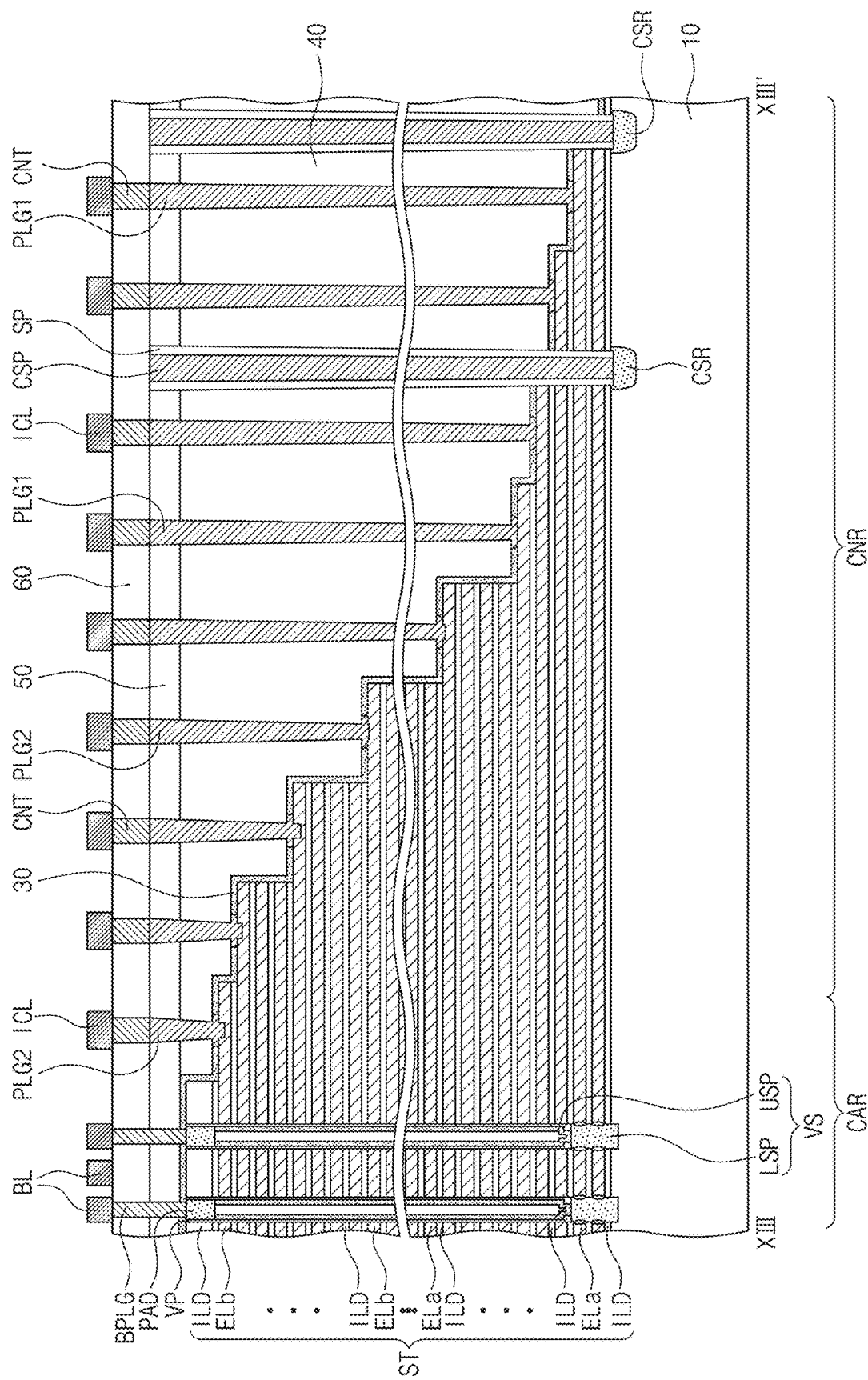
FIG. 13 illustrates a cross-sectional view taken along line XIII-XIII' of FIG. 12, showing a three-dimensional semiconductor memory device according to an example embodiment of the present inventive concepts.

FIG. 12 illustrates a plan view of a three-dimensional semiconductor memory device according to an example embodiment of the present inventive concepts. FIG. 13 illustrates a cross-sectional view taken along line XIII-XIII' of FIG. 12, showing a three-dimensional semiconductor memory device according to an example embodiment of the present inventive concepts. For brevity of the description, omission will be made in explaining and illustrating technical features the same as those of the three-dimensional semiconductor device discussed above.

In some example embodiments, the electrode structure ST may have variously-shaped stepwise structures on the connection region CTR. For example, referring to FIGS. 12 and 13, on the connection region CNR, the electrode structure ST may have a first stepwise structure defined by end portions of the electrodes ELa and ELb along the first direction D1 and a second stepwise structure defined by end portions of the electrode ELa and ELb along the second direction D2. The first stepwise structure defined along the first direction D1 may be inclined steeper than the second stepwise structure defined along the second direction D2. End portions of the electrodes ELa and ELb at a $(4n+1)^{th}$ layer may be exposed along the first direction D1. Further, end portions of individual sets of four of the electrodes ELa and/or the electrodes ELb, which are continuously stacked, may be exposed along the second direction D2.

In some example embodiments, the contact plugs PLG1 and PLG2 arranged along the first direction D1 may have different lengths from each other, and the contact plugs PLG1 and PLG2 arranged along the second direction D2 may also have different lengths from each other. Further, as discussed above, each of the contact plugs PLG1 and PLG2 may include an extended portion and a contacted portion.

Figure 20A:
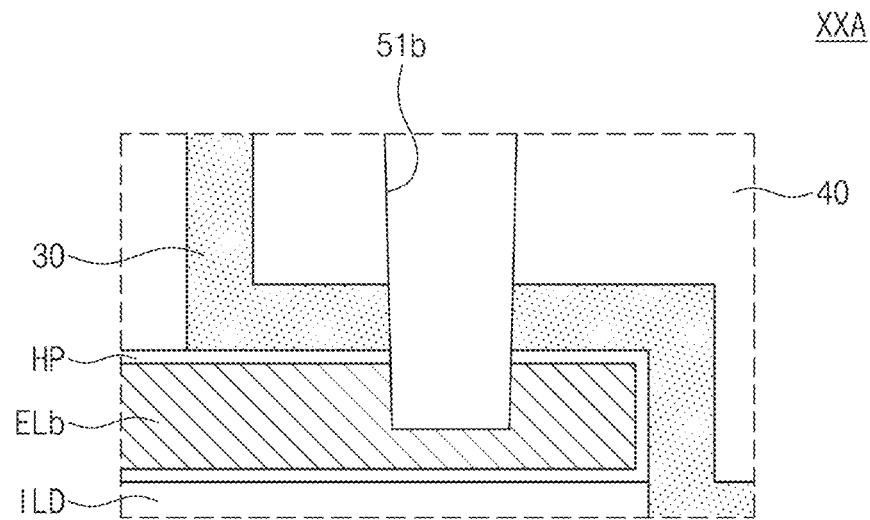
FIGS. 20A and 20B illustrate enlarged views of sections XXA and XXB of FIG. 19, respectively.
Figure 20B:
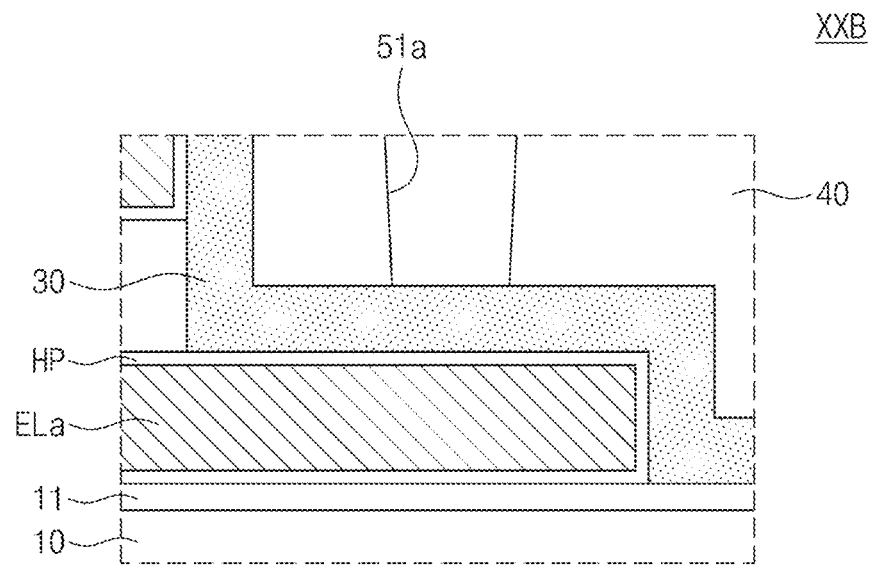
Figure 21:
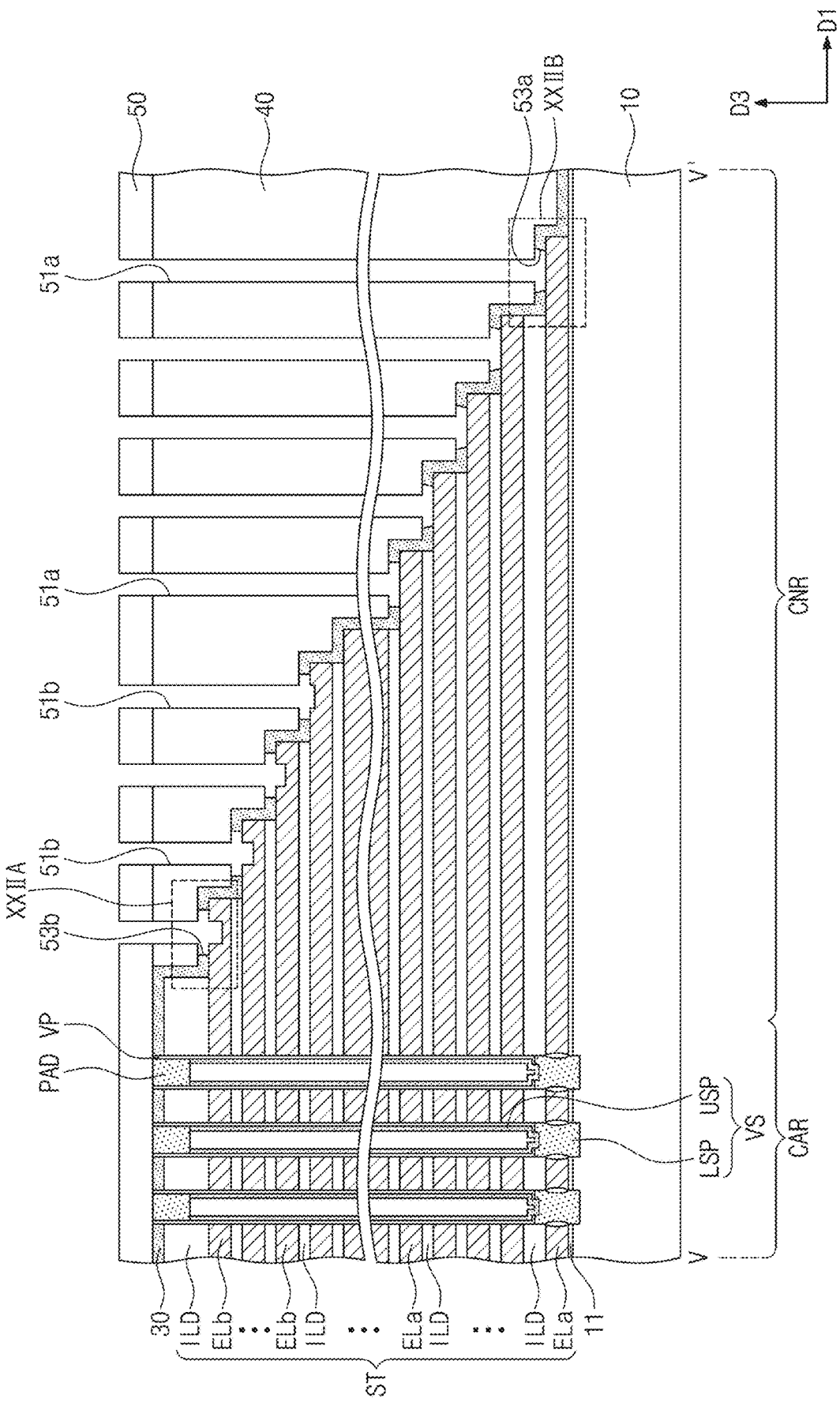
Figure 22A:
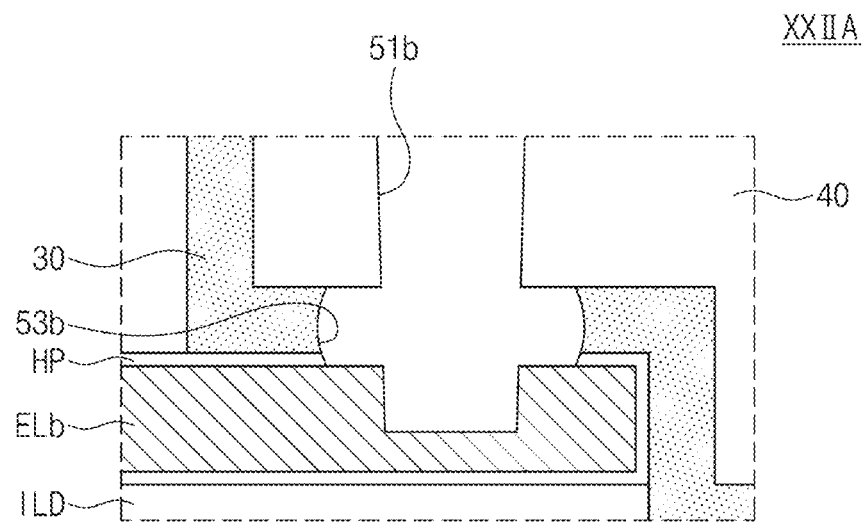
FIGS. 22A and 22B illustrate enlarged views of sections XXIIA and XXIIB of FIG. 21, respectively.
Figure 22B:
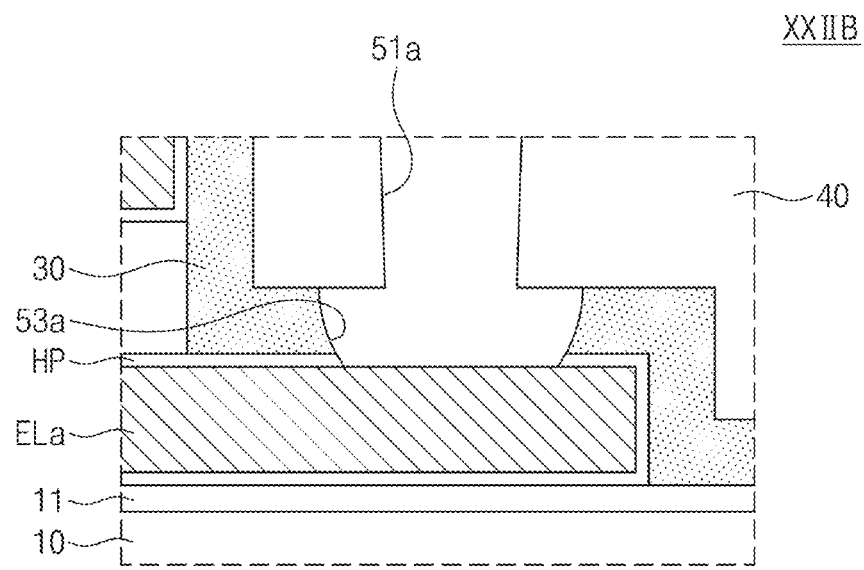

FIGS. 14 to 19, 21, and 23 illustrate cross-sectional views taken along line V-V' of FIG. 4, showing a method of fabricating a three-dimensional semiconductor memory device according to an example embodiment of the present inventive concepts. FIGS. 20A and 20B illustrate enlarged views of sections XXA and XXB of FIG. 19, respectively. FIGS. 22A and 22B illustrate enlarged views of sections XXIIA and XXIIB of FIG. 21, respectively.

Figure 14:
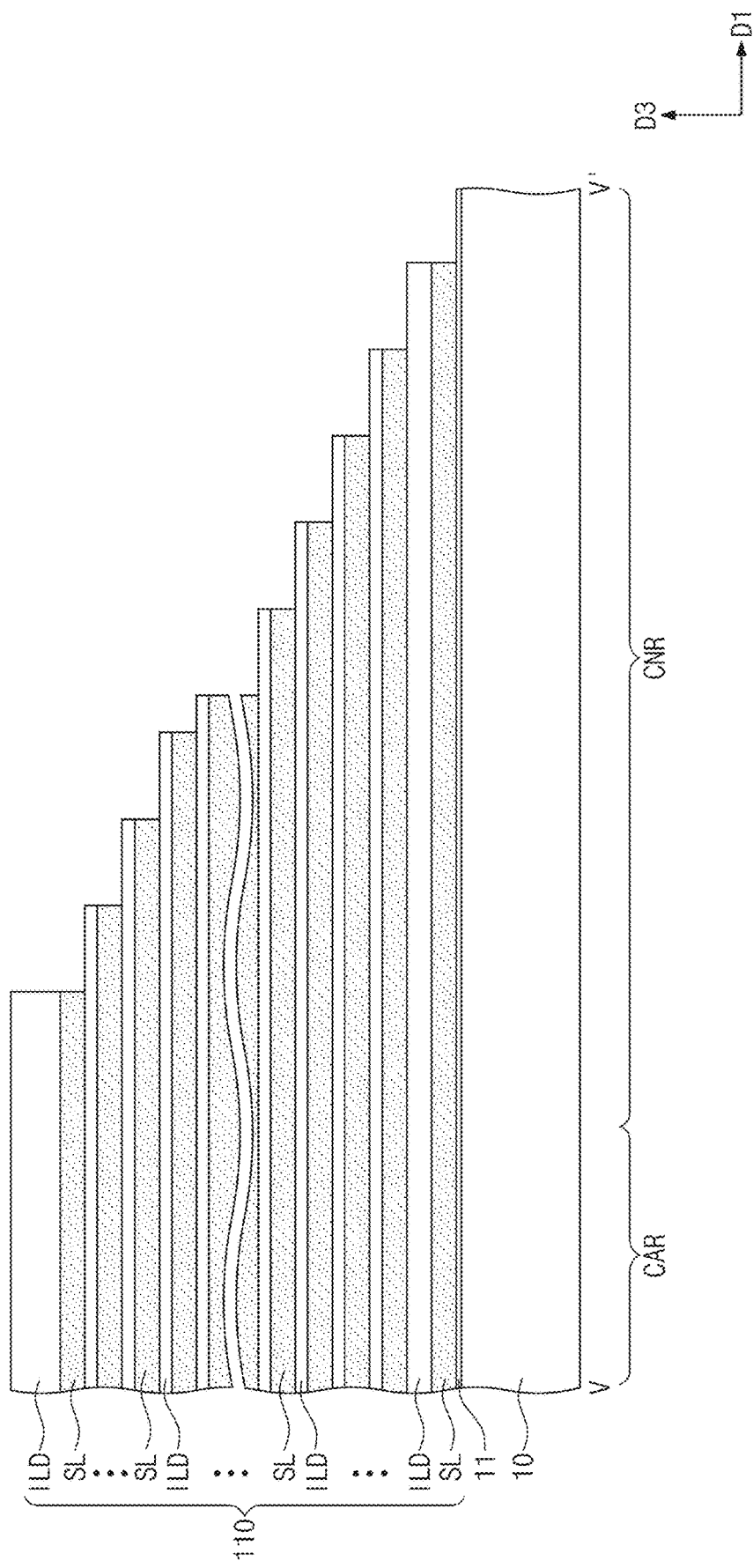
FIGS. 14 to 19, 21, and 23 illustrate cross-sectional views taken along line V-V' of FIG. 4, showing a method of fabricating a three-dimensional semiconductor memory device according to an example embodiment of the present inventive concepts.

Referring to FIGS. 4 and 14, a substrate 10 may be provided to include a cell array region CAR and a connection region CNR. A mold structure 110 may be formed to include sacrificial layers SL and insulation layers ILD that are vertically and alternately stacked on the substrate 10. An insulating material such as silicon oxide may be provided to form a buffer insulation layer 11 between the substrate 10 and the mold structure 110.

The sacrificial layers SL may include a material having an etch selectivity with respect to the insulation layers ILD. The sacrificial layers SL may include an insulating material different from that of the insulation layers ILD. For example, the sacrificial layers SL may be formed of a silicon nitride layer, and the insulation layers ILD may be formed of a silicon oxide layer. The sacrificial layers SL may have substantially the same thickness, and the insulation layers ILD may have different thicknesses depending on their positions.

In some example embodiments, the mold structure 110 may have a stepwise structure in which end portions of the insulation layers ILD are exposed on the connection region CNR. For example, the formation of the mold structure 110 may include forming on an entire surface of the substrate 10 a stacked structure (not shown) in which the sacrificial layers SL and the insulation layers ILD are vertically and alternately stacked and then performing a trimming process on the stacked structure. In this description, the trimming process may include forming on the cell array region CAR and the connection region CNR a mask pattern (not shown) covering the stacked structure, etching a portion of the stacked structure, and reducing a horizontal area of the mask pattern. When the trimming process is carried out, the etching and reducing steps may be alternately and repeatedly performed. The trimming process may result in the mold structure 110 having a stepwise structure that descends from the cell array region CAR toward a peripheral circuit region outside the connection region CNR.

Figure 15:
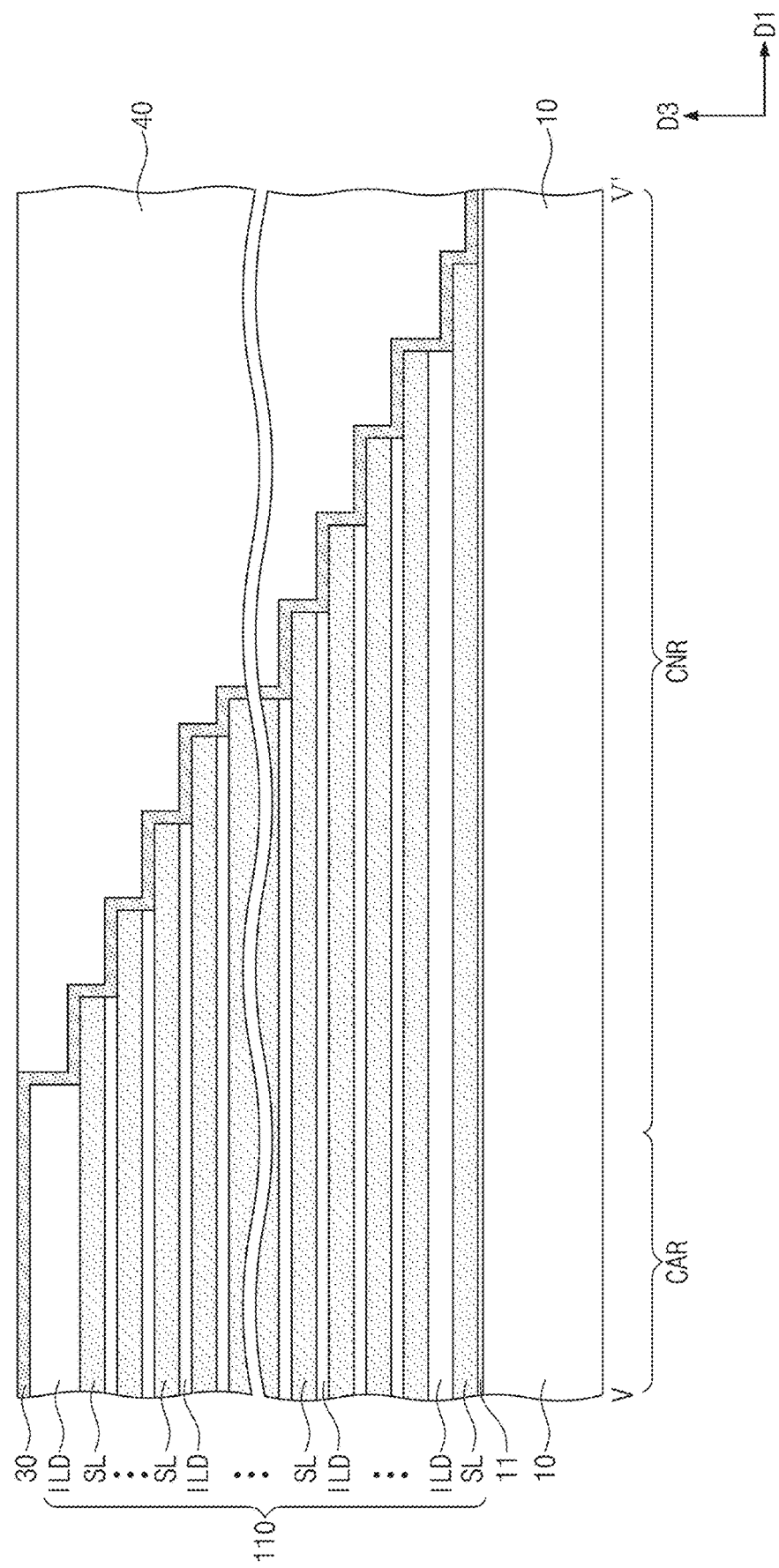

Referring to FIGS. 4 and 15, end portions of the insulation layers ILD may be etched to expose end portions of the sacrificial layers SL on the connection region CNR. After exposing the end portions of the sacrificial layers SL on the connection region CNR, an etch stop layer 30 may be formed to conformally cover a surface of the mold structure 110. The etch stop layer 30 may be, on the connection region CNR, in direct contact with the end portions of the sacrificial layers SL. The etch stop layer 30 may be the amorphous boron layer discussed with reference to FIGS. 1A to 1E.

After the etch stop layer 30 is formed, an insulation layer (not shown) may be formed on the entire surface of the substrate 10, and be planarized to from a planarized insulation layer 40. The planarized insulation layer 40 may have a substantially flat top surface. The planarized insulation layer 40 may be formed of a material having an etch selectivity with respect to the etch stop layer 30.

Figure 16:
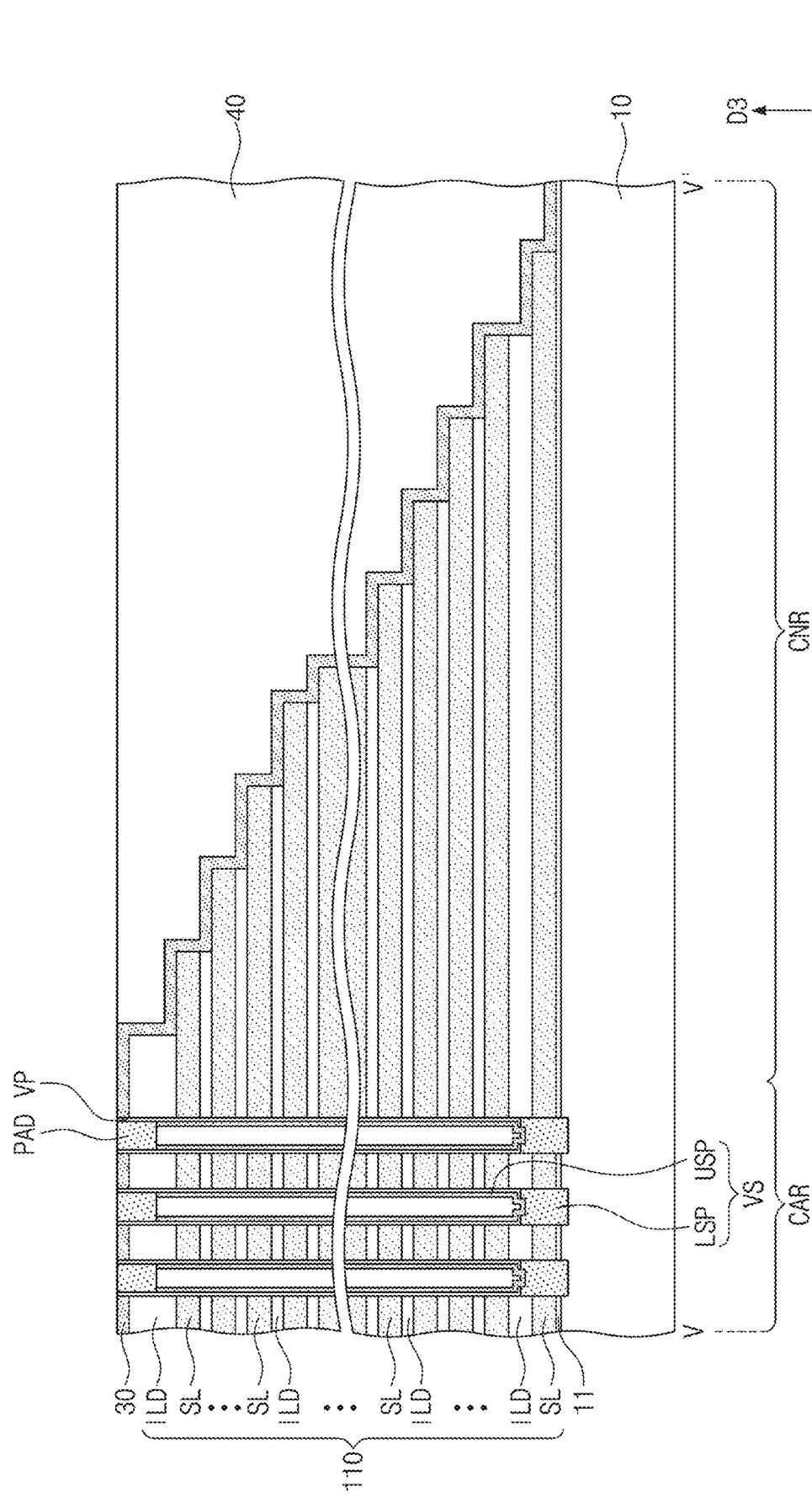

Referring to FIGS. 4 and 16, after the planarized insulation layer 40 is formed, vertical structures VS may be formed on the cell array region CAR to penetrate the mold structure 110 and the buffer insulation layer 11. As viewed in a plan view, the vertical structures VS may be arranged in a straight or zigzag fashion. In the connection region CNR, dummy vertical structures may be formed to have substantially the same structures as those of the vertical structures VS.

The formation of the vertical structures VS may include forming vertical holes that penetrate the mold structure 110 and the buffer insulation layer 11 to expose the substrate 10, and then forming lower and upper semiconductor patterns LSP and USP in each of the vertical holes.

The lower semiconductor pattern LSP may be formed using a selective epitaxial growth (SEG) process in which the substrate 10 exposed to the vertical 1 holes is served as a seed layer. Accordingly, the lower semiconductor pattern LSP may have a pillar shape that fills each of the lower portions of the vertical holes. The upper semiconductor pattern USP may be formed by depositing a semiconductor layer in the vertical holes in which the lower semiconductor pattern LSP is formed, and may be in contact with the lower semiconductor pattern LSP.

A vertical insulation pattern VP may be formed in the vertical holes before the upper semiconductor pattern USP is formed. The vertical insulation pattern VP may include a single thin layer or a plurality of thin layers. In some example embodiments, the vertical insulation pattern VP may be a portion of a data storage layer. A bit line pad PAD may be formed at or on each top end of the upper semiconductor patterns USP. The bit line pad PAD may be an impurity doped region or may include a conductive material.

Figure 17:
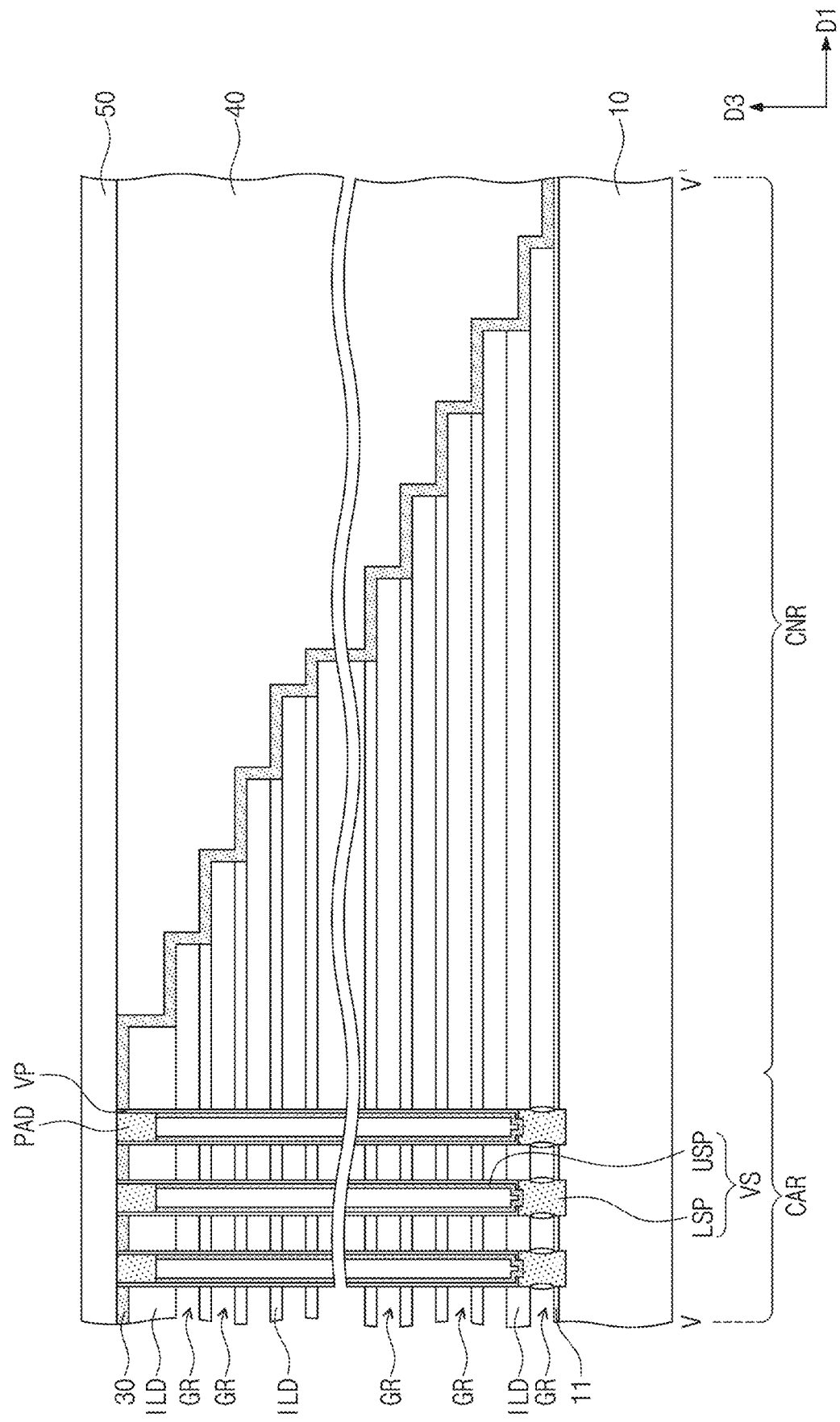

Referring to FIGS. 4 and 17, a first interlayer dielectric layer 50 may be formed on the planarized insulation layer 40 and on the cell array region to cover top surfaces of the vertical structures VS. The first interlayer dielectric layer 50, the planarized insulation layer 40, and the mold structure 110 may be patterned to form line-shaped trenches (not shown). The trenches may extend in a first direction D1 and may be spaced apart from each other in a second direction D2 crossing the first direction D1. The formation of the trenches may cause the mold structure 110 to have a linear shape extending in the first direction D1, in a plan view. The trenches may be spaced apart from the vertical structures VS and may expose sidewalls of the sacrificial layers SL.

After the trenches are formed, common source regions CSR may be formed in the substrate 10 exposed by the trenches. The common source regions CSR may be formed by doping the substrate 10 with an impurity whose conductivity is different from that of the substrate 10. The common source regions CSR may include, for example, an N-type impurity (e.g., arsenic (As) or phosphorous (P)).

The sacrificial layers SL exposed by the trenches may be removed to form gate regions GR between the insulation layers ILD vertically adjacent to each other. The gate regions GR may be formed by isotropically etching the sacrificial layers SL using an etch recipe having an etch selectivity with respect to the insulation layers ILD and the etch stop layer 30. For example, when the sacrificial layers SL are silicon nitride layers, the insulation layers ILD are silicon oxide layers, and the etch stop layer 30 is an amorphous boron layer, an etchant including phosphoric acid may be used to isotropically etch the sacrificial layers SL to form the gate regions GR. Each of the gate regions GR may partially expose the vertical insulation pattern VP, and on the connection region CNR, may partially expose the etch stop layer 30.

Figure 18:
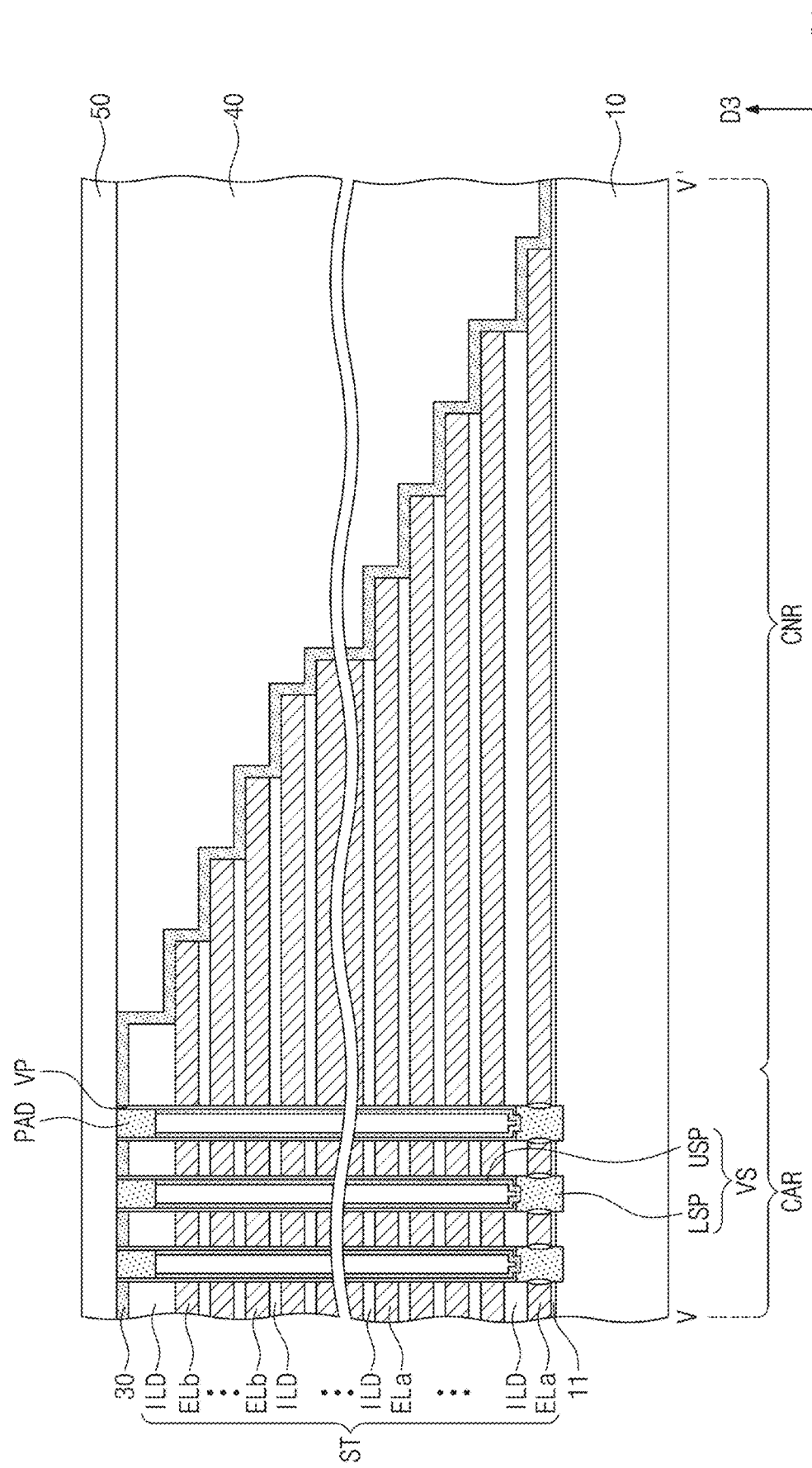
Figure 19:
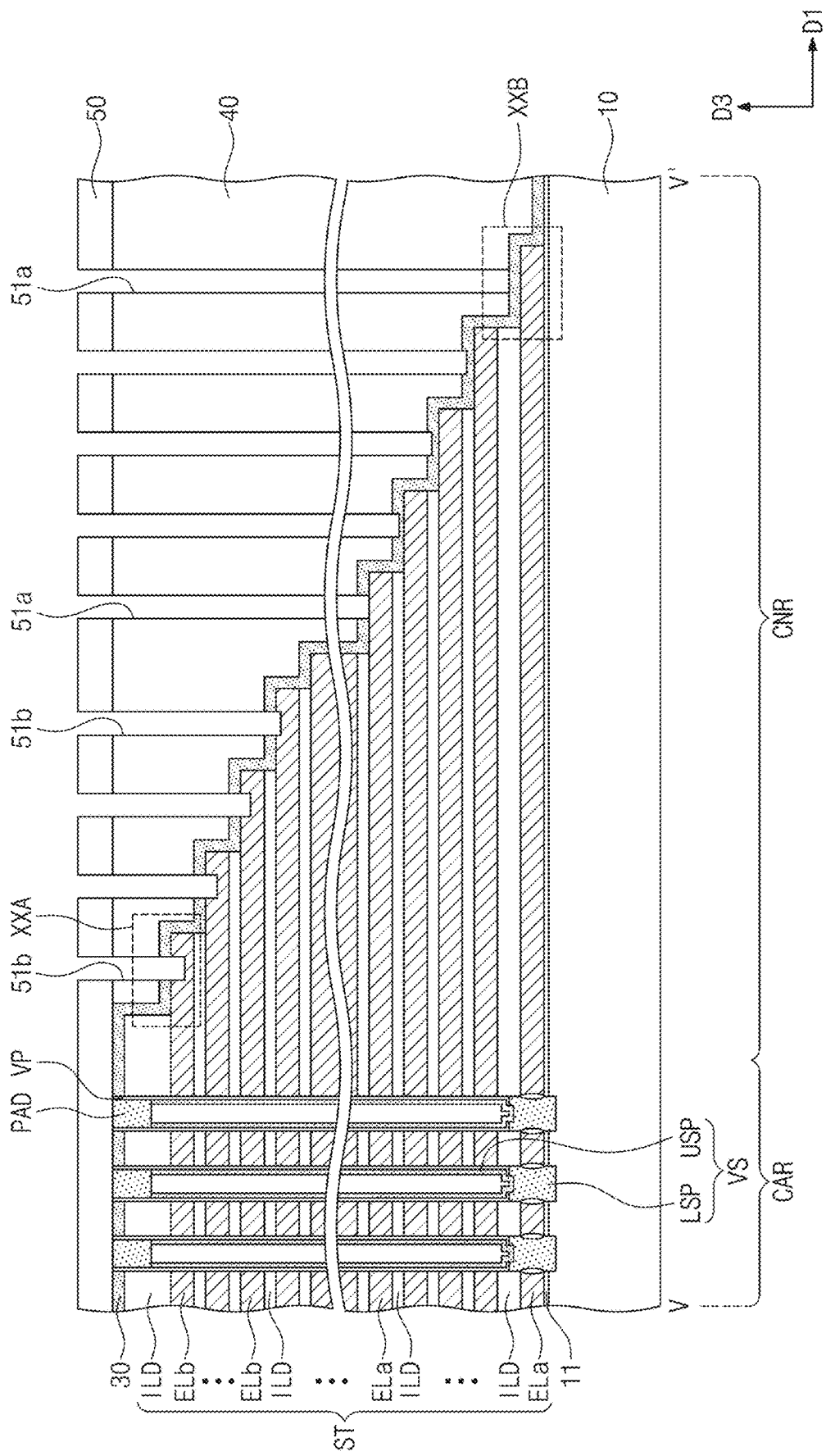

Referring to FIGS. 4 and 18, horizontal insulation patterns HP and electrodes ELa and ELb may be formed in the gate regions GR. The formation of the horizontal insulation patterns HP and the electrodes ELa and ELb may include forming a horizontal insulation layer to conformally cover the gate regions GR, forming a gate conductive layer filling the gate regions GR on the horizontal insulation layer, and removing the gate conductive layer from the trenches to form horizontal separations for the respective electrodes ELa and ELb. Further, before the horizontal insulation layer is formed, a thermal oxide layer may be formed on a sidewall of the lower semiconductor pattern LSP exposed by a lowermost gate region GR. The horizontal insulation pattern HP may serve as a portion of a data storage layer, as discussed above.

The electrodes ELa and ELb may be formed in the gate regions GR as discussed above to form electrode structures ST having the insulation layers ILD and the electrodes ELa and ELb that are alternately and repeatedly stacked on the substrate 10. According to some example embodiments different from that discussed with reference to FIGS. 4 and 17, common source regions CSR may be formed, after the electrode structures ST are formed, by doping an impurity into the substrate 10 between the electrode structures ST.

Referring to FIGS. 4, 19, 20A, and 20B, after the electrode structures ST are formed, on the connection region CNR, the first interlayer dielectric layer 50 and the planarized insulation layer 40 may be patterned to form first contact holes 51*a* and second contact holes 51*b*.

The first and second contact holes 51*a* and 51*b* may be formed by forming a mask pattern (not shown) on the first interlayer dielectric layer 50, and then performing an anisotropic etching process using plasma on the first interlayer dielectric layer 50 and the planarized insulation layer 40. The anisotropic etching process using plasma may be performed until exposing the etch stop layer 30 covering a top surface of a lowermost first electrode ELa.

In some example embodiments, the first and second contact holes 51*a* and 51*b* may be formed at the same time, and when the anisotropic etching process is performed, etching depths may be different because the electrode structure ST has the stepwise structure on the connection region CNR. For example, the first and second contact holes 51*a* and 51*b* may have lengths in a third direction D3 that increase with increasing distance from the cell array region CAR. A top surface of the etch stop layer 30 may be exposed by one of the first contact holes 51*a* that has the greatest depth in the third direction D3, while an uppermost second electrode ELb may be exposed to one of the second contact holes 51*b* that has the smallest length in the third direction D3 and penetrates the etch stop layer 30 to a certain depth. In this configuration, bottom surfaces of the first and second contact holes 51*a* and 51*b* may be placed at different positions with regard to top surfaces of corresponding gate first and second electrodes ELa and ELb, respectively.

For example, when the first and second contact holes 51*a* and 51*b* are formed, the etch stop layer 30 may be exposed first to the second contact holes 51*b* than to the first contact holes 51*a*, and portions of the etch stop layer 30 exposed to the second contact holes 51*b* may be physically over-etched by plasma. The second contact holes 51*b* may thus penetrate the etch stop layer 30. Further, top surfaces of the second electrodes ELb may be recessed to a certain depth on the connection region CNR when the second contact holes 51*b* are formed, and the second electrodes ELb may be recessed deeper with increasing their height from the substrate 10. For example, the second electrodes ELb may have different thicknesses at their portions exposed by the second contact holes 51*b*. The bottom surfaces of the second contact holes 51*b* may be placed between top and bottom surfaces of the second electrodes ELb. The etch stop layer 30 may be exposed by the first contact holes 51*a*, and may have different thicknesses at its portions exposed by the first contact holes 51*a*. The exposed thicknesses of the etch stop layer 30 at its portions exposed by the first contact holes 51*a* may decrease as the first electrodes ELa are increased in height from the substrate 10.

Referring to FIGS. 4, 21, 22A, and 22B, an isotropic etching process may be performed on the etch stop layer 30 exposed by the first and second contact holes 51*a* and 51*b* to form lower recess regions 53*a* exposing end portions of the first electrodes ELa and to also form upper recess regions 53*b* exposing end portions of the second electrodes ELb.

In some example embodiments, when the etch stop layer 30 is an amorphous boron layer, the etch stop layer 30 may be etched by a wet etching process using a wet etchant (e.g., an SC1 solution) that includes hydrogen peroxide ($H_2O_2$). The wet etching process may be carried out until an end portion of the lowermost first electrode ELa is exposed.

When the isotropic etching process is performed on the etch stop layer 30, the etch stop layer 30 may be vertically and horizontally etched on its portions exposed by the first contact holes 51*a* and on its portions exposed by the second contact holes 51*b*. Accordingly, the lower and upper recess regions 53*a* and 53*b* may have different sidewall profiles from each other. Further, when the isotropic etching process is performed on the etch stop layer 30, the horizontal insulation pattern HP may be partially exposed so that the end portions of the first electrodes ELa is exposed by the lower recess regions 53*a*.

Figure 23:
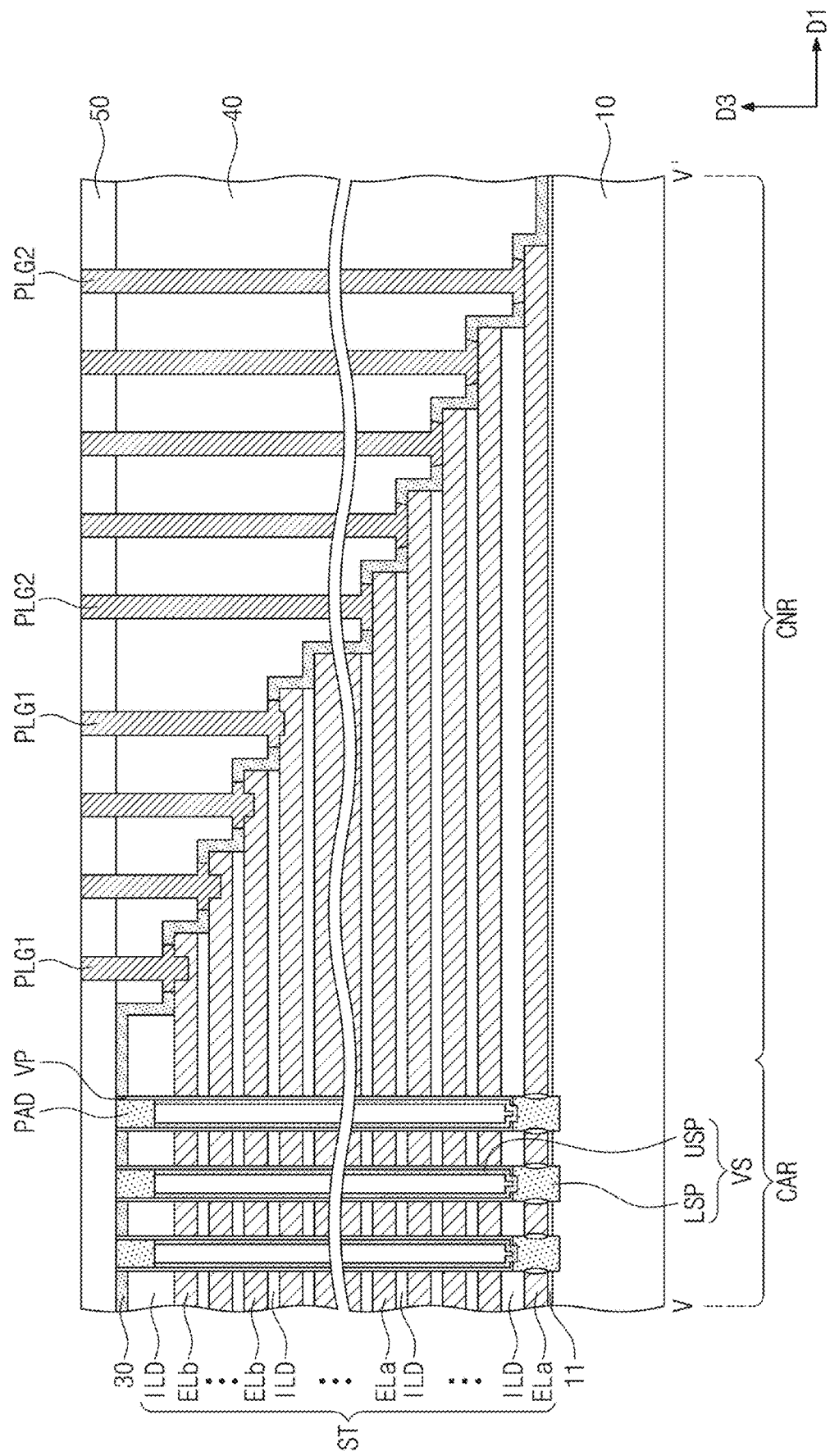

Referring to FIGS. 4 and 23, the lower and upper recess regions 53*a* and 53*b* may be filled with a conductive material to form first and second contact plugs PLG1 and PLG2. Thereafter, as discussed with reference to FIG. 5, a second interlayer dielectric layer 60, interconnection contact plugs CNT, bit line contact plugs BPLG, bit lines BL, and interconnection lines ICL may be formed.

Figure 24:
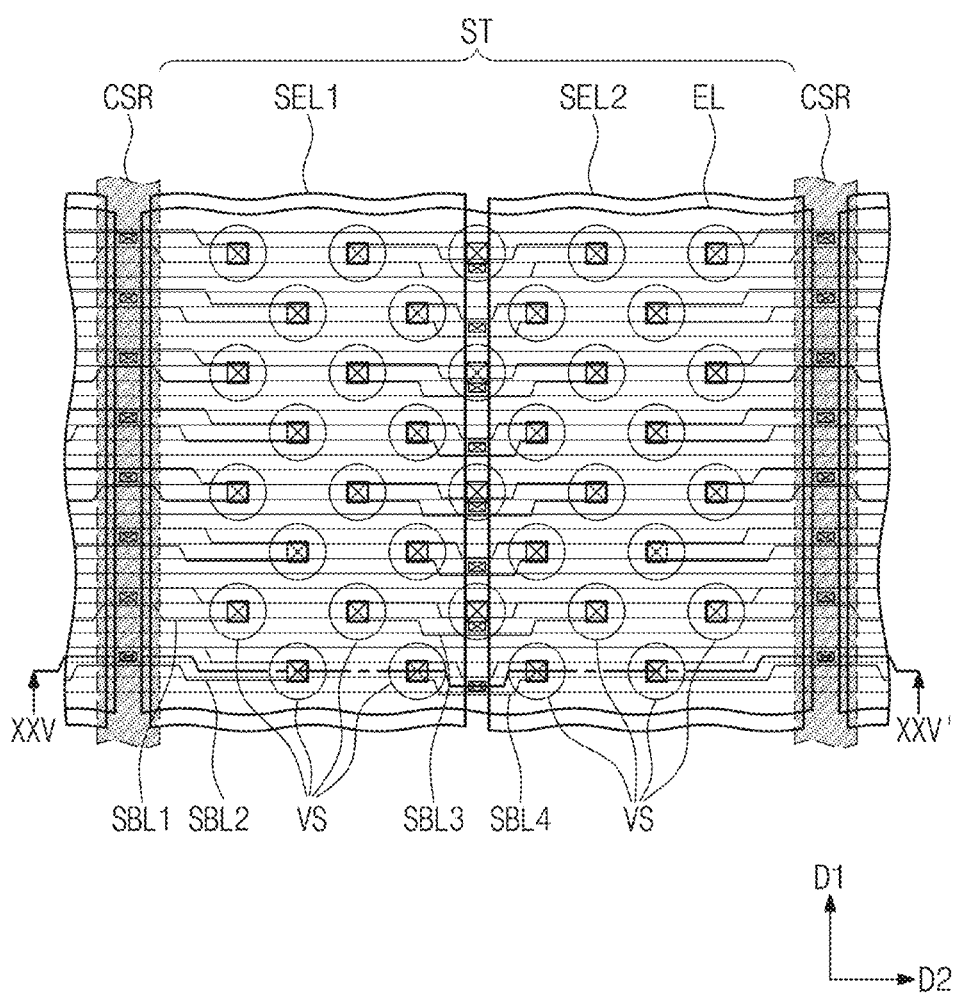
FIG. 24 illustrates a plan view of a three-dimensional semiconductor memory device according to an example embodiment of the present inventive concepts.

FIG. 24 illustrates a plan view of a three-dimensional semiconductor memory device according to an example embodiment of the present inventive concepts. FIGS. 25 to 32 illustrate cross-sectional views taken along line XXV-XXV' of FIG. 24, showing a method of fabricating a three-dimensional semiconductor memory device according to an example embodiment of the present inventive concepts. FIG. 33 illustrates an enlarged view of section XXXIII of FIG. 32.

According to the embodiments illustrated in FIGS. 24 to 33, when vertical structures are formed on a cell array region of a three-dimensional semiconductor memory device, the amorphous boron layer discussed with reference to FIGS. 1A to 1E may serve as an etch stop layer. For brevity of the description, omission will be made in explaining and illustrating technical features the same as those of the three-dimensional semiconductor device discussed above.

Figure 25:
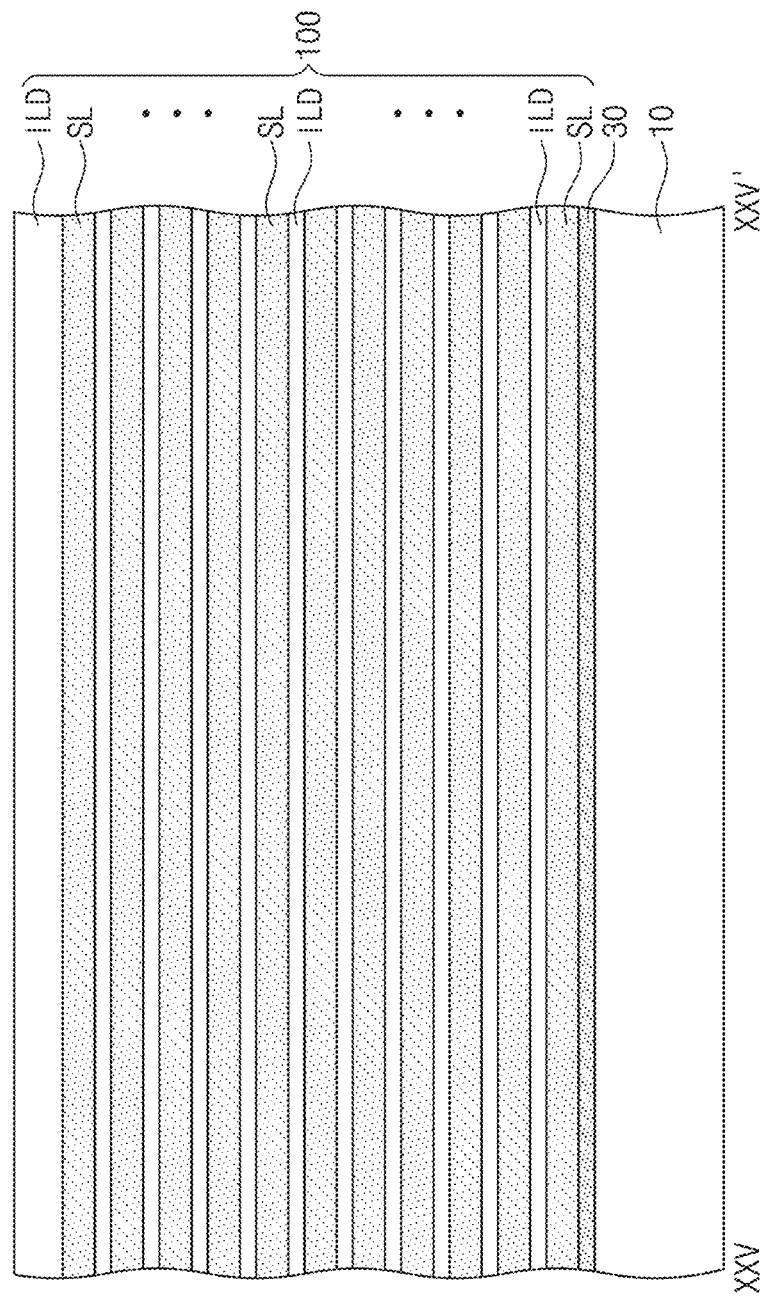
FIGS. 25 to 32 illustrate cross-sectional views taken along line XXV-XXV' of FIG. 24, showing a method of fabricating a three-dimensional semiconductor memory device according to an example embodiment of the present inventive concepts.

Referring to FIGS. 24 and 25, an etch stop layer 30 may be formed on a substrate 10, and sacrificial layers SL and insulation layers ILD may be alternately and repeatedly stacked to form a stacked structure 100 on the etch stop layer 30. The etch stop layer 30 may include an insulating material having an etch selectivity with respect to the sacrificial layers SL and the insulation layers ILD. For example, the etch stop layer 30 may be an amorphous boron layer, which include about 90 to 100 atomic percent of boron.

Figure 26:
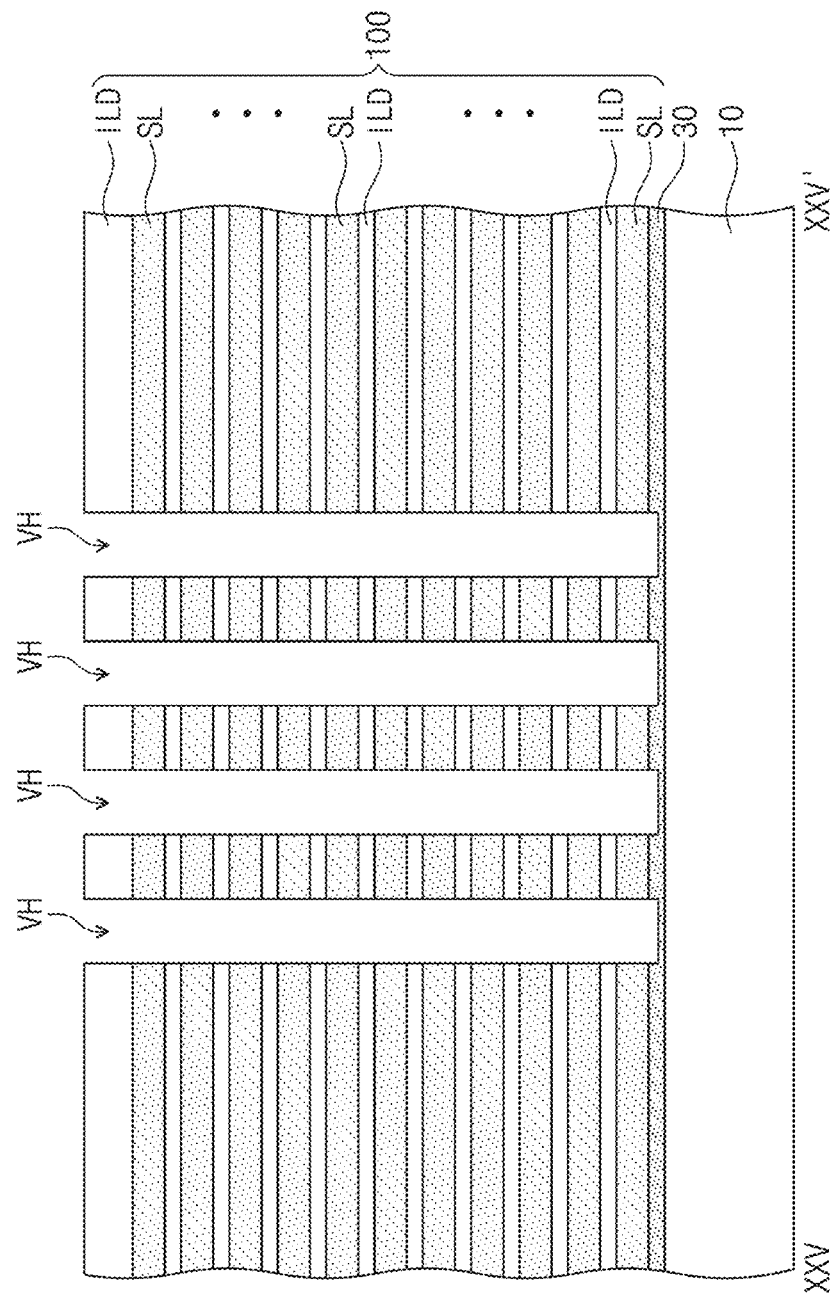

Referring to FIGS. 24 and 26, vertical holes VH may be formed to penetrate the stacked structure 100 and expose a top surface of the etch stop layer 30. When an isotropic etching process is performed to form the vertical holes VH, the etch stop layer 30 may be partially recessed on its top surface exposed by the vertical holes VH.

Figure 27:
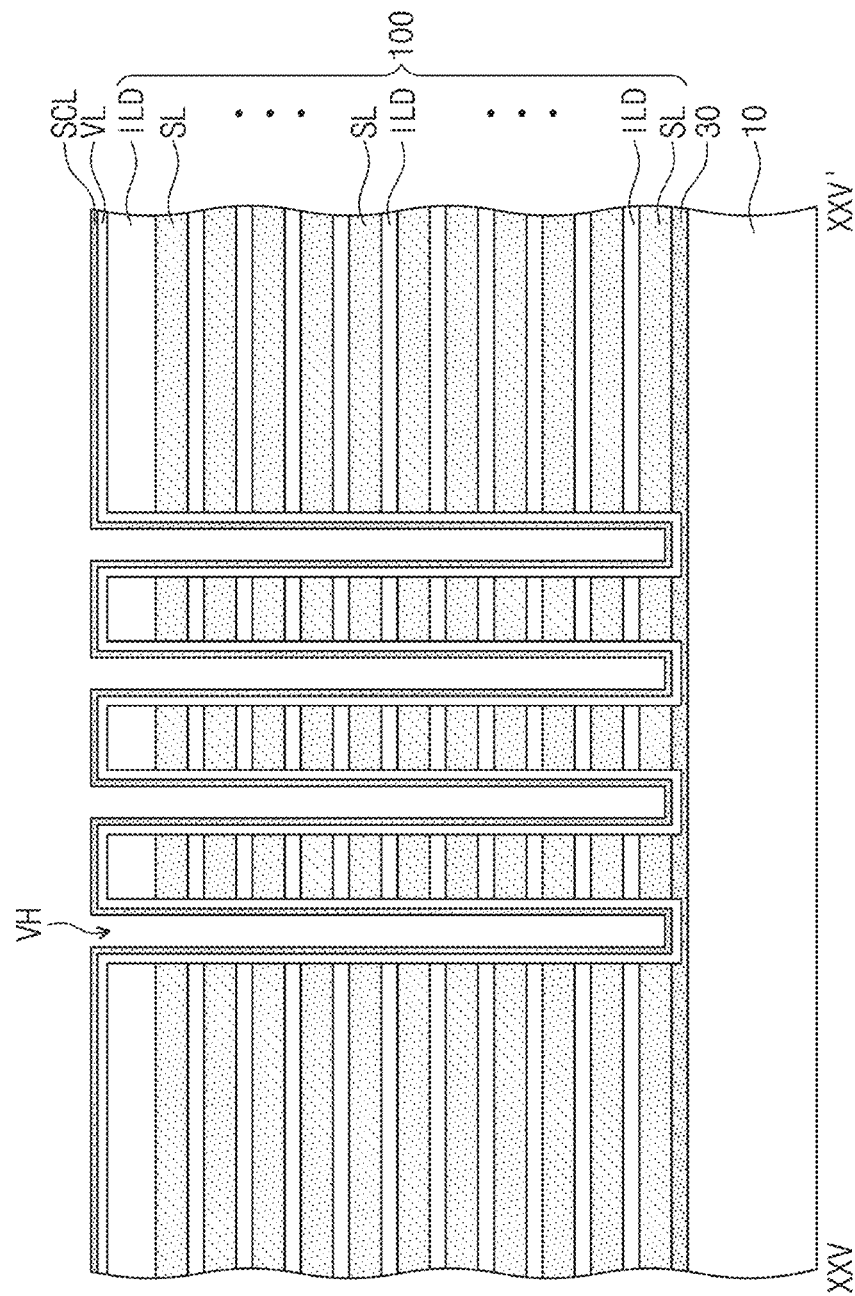

Referring to FIGS. 24, 27, and 33, a vertical insulation layer VL and a preliminary semiconductor layer SCL may be sequentially formed to conformally cover inner walls of the vertical holes VH. The vertical insulation layer VL and the preliminary semiconductor layer SCL may be deposited on the inner walls of the vertical holes VH at a thickness insufficient to completely fill the vertical holes VH.

The vertical insulation layer VL may be formed of a single thin layer or a plurality of thin layers, and may include an insulation layer having an etch selectivity with respect to the sacrificial layers SL. In some example embodiments, the vertical insulation layer VL may include at least one of thin layers used for data storage layers of, for example, NAND Flash memory devices.

The preliminary semiconductor layer SCL may include a semiconductor material (e.g., a polycrystalline silicon layer, a single crystalline silicon layer, or an amorphous silicon layer) formed using one of atomic layer deposition (ALD) and chemical vapor deposition (CVD).

Figure 28:
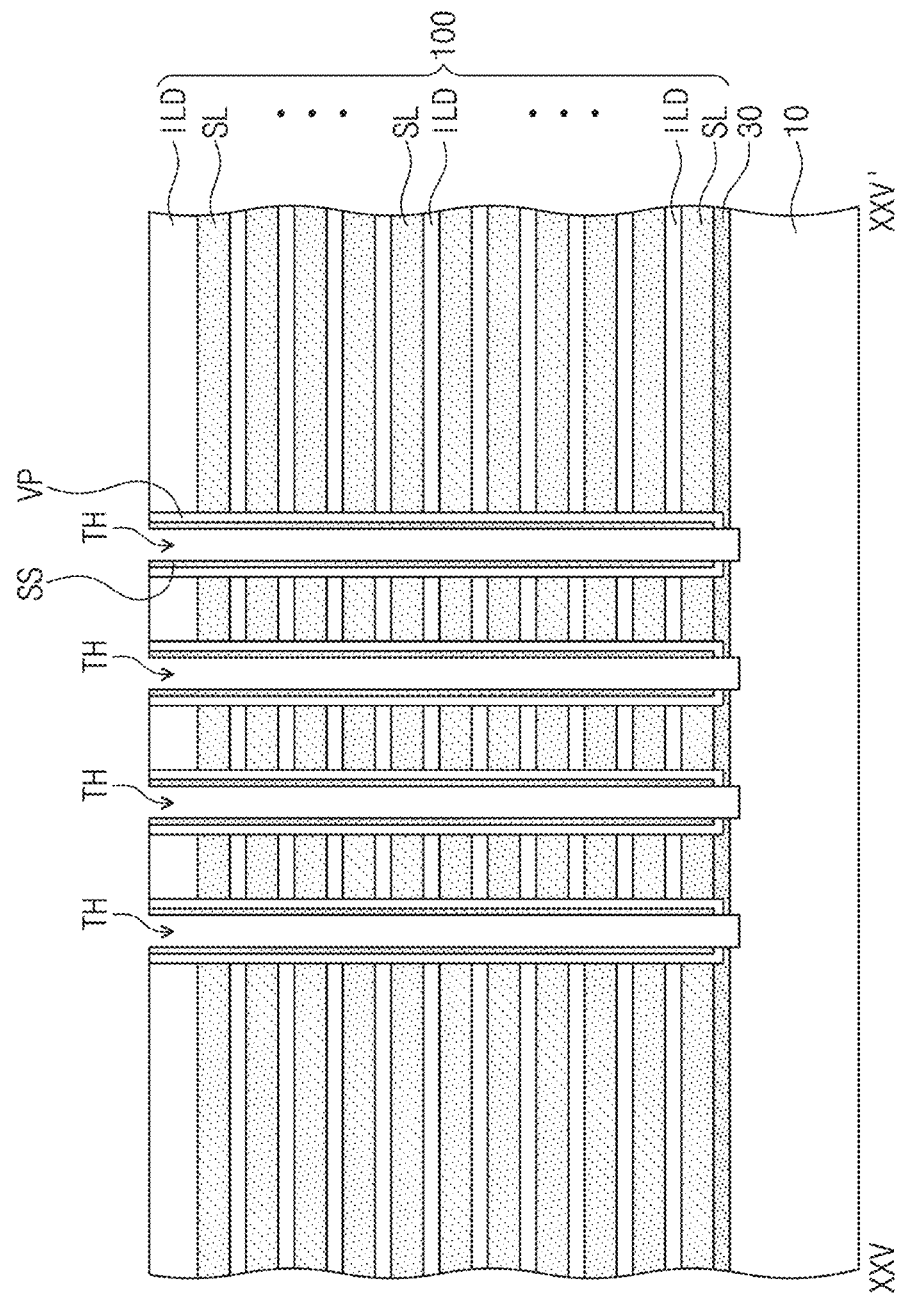

Referring to FIGS. 24 and 28, an anisotropic etching process may be performed to remove the preliminary semiconductor layer SCL and the vertical insulation layer VL at bottoms of the vertical holes VH, thereby forming through holes TH to expose a top surface of the substrate 10. Through the aforementioned step, a vertical insulation pattern VP and a semiconductor spacer SS may be formed on the sidewall of the vertical hole VH. The vertical insulation pattern VP and the semiconductor spacer SS may have a cylindrical shape with openings at opposite ends. For example, as illustrated in FIG. 33, the vertical insulation pattern VP may include a tunnel insulation layer TIL, a charge storage layer CIL, and a blocking insulation layer BLK.

In some example embodiments, a bottom surface of the vertical insulation pattern VP may be in contact with the etch stop layer 30. When the anisotropic etching process is performed to form the vertical insulation pattern VP and the semiconductor spacer SS, the top surface of the substrate 10 may be partially recessed by over-etch.

Figure 29:
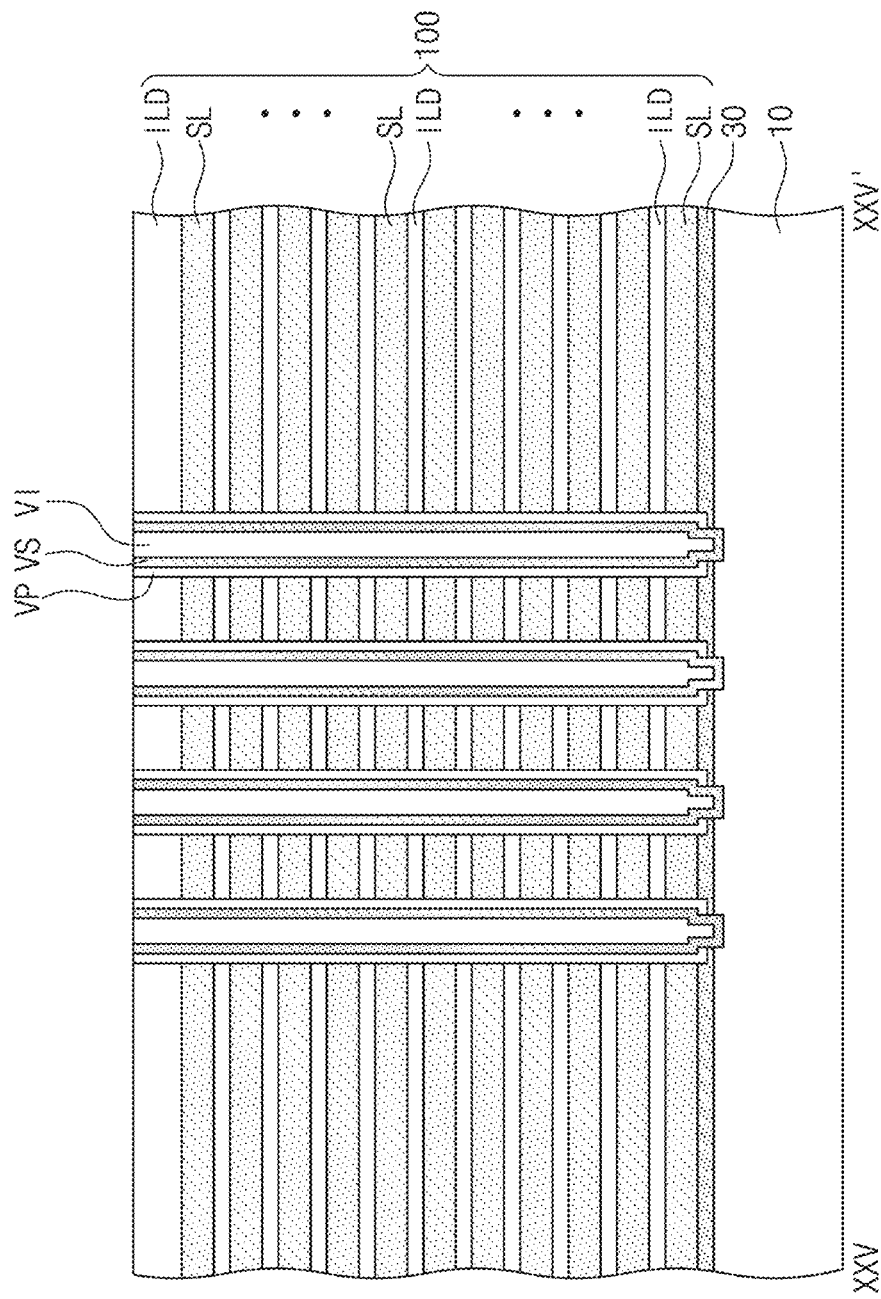

Referring to FIGS. 24 and 29, a vertical structure VS and a buried insulation layer VI may be sequentially formed in the vertical holes VH in which the vertical insulation pattern VP and the semiconductor spacer SS have been formed. The vertical structure VS may be formed by depositing a semiconductor material (e.g., a polycrystalline silicon layer, a single crystalline layer, or an amorphous silicon layer), which is the same as that of the semiconductor spacer SS. The vertical structure VS may be conformally deposited on the semiconductor spacer SS, while not completely filling the vertical holes VH. The vertical structure VS may be in contact with the substrate 10. The buried insulation pattern VI may fill an empty space defined by the vertical structure VS.

Figure 30:
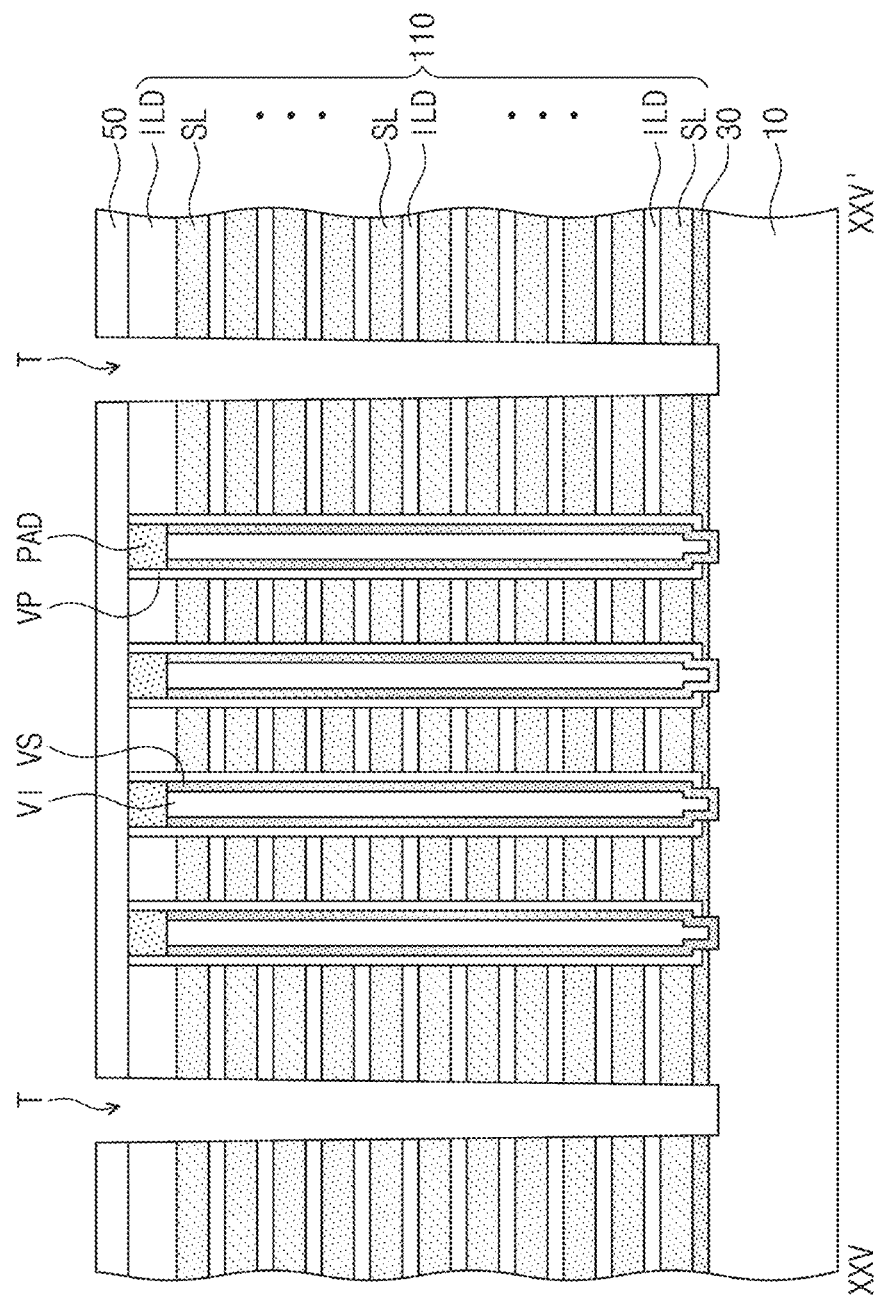

Referring to FIGS. 24 and 30, bit line pads PAD may be formed on the vertical structures VS. The bit line pads PAD may be an impurity doped region or may include a conductive material.

After the bit line pads PAD are formed, a first interlayer dielectric layer 50 may be formed on the stacked structure 100. The first interlayer dielectric layer 50 and the stacked structure 100 may be patterned to form trenches T exposing the substrate 10. The trenches T may extend along a first direction D1 from a cell array region (see CAR of FIG. 14) toward a connection region (see CNR of FIG. 14). The formation of the trenches T may divide the stacked structure 100 into a plurality of mold structures 110. Each of the mold structures 110 may have a linear shape extending in the first direction D1. In some example embodiments, a pair of the trenches T may be provided therebetween with the vertical structures VS constituting nine columns. The trenches T may expose sidewalls of the insulation and sacrificial layers ILD and SL of the mold structure 110.

Figure 31:
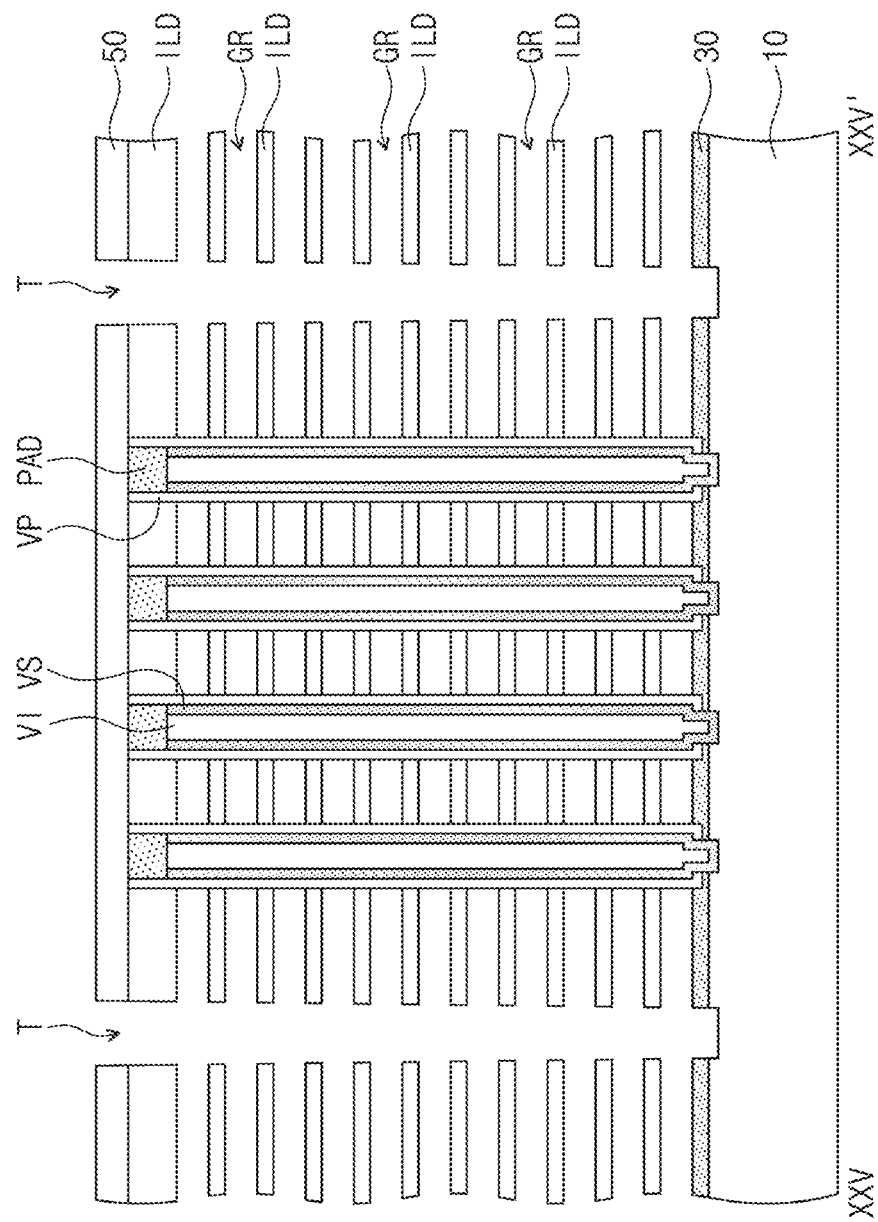

Referring to FIGS. 24 and 31, the sacrificial layers SL exposed to the trenches T may be removed to form gate regions GR between the insulation layers ILD. The gate regions GR may be formed by isotropically etching the sacrificial layers SL using an etch recipe having an etch selectivity with respect to the insulation layers ILD and the etch stop layer 30. As discussed in the aforementioned example embodiments, when the etch stop layer 30 is an amorphous boron layer, the sacrificial layers SL are silicon nitride layers, and the insulation layers ILD are silicon oxide layers, an etchant including phosphoric acid may be provided through the trenches T to selectively isotropically etch the sacrificial layers SL.

Figure 32:
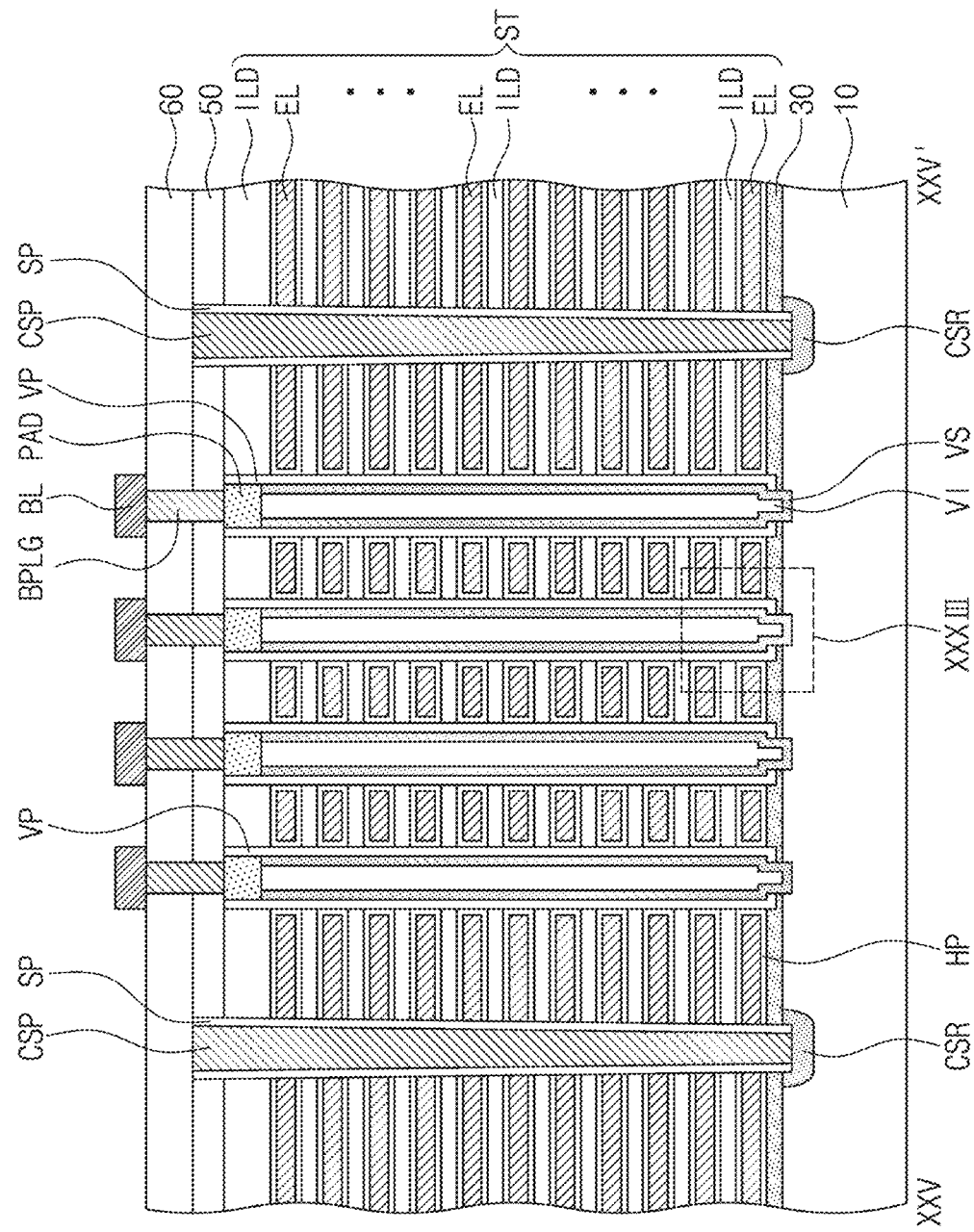
Figure 33:
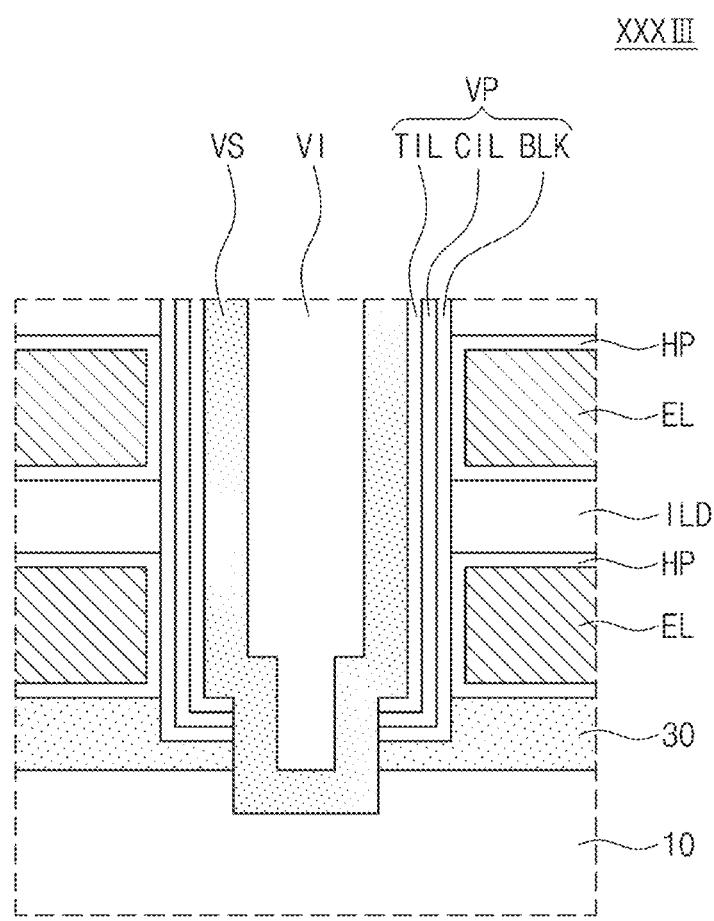
FIG. 33 illustrates an enlarged view of section XXXIII of FIG. 32.

Referring to FIGS. 24, 32, and 33, a horizontal insulation pattern HP and electrodes EL may be formed in the gate regions GR. The horizontal insulation pattern HP may be a portion of a data storage layer in, for example, an NAND Flash memory transistor. As the electrodes EL (e.g., Ela and ELb) are formed in the gate regions GR, electrode structures ST may include the insulation layers ILD and the electrodes EL alternately stacked on the substrate 10. After the electrode structures ST are formed, the substrate 10 exposed to the trenches T may be doped with an impurity to form common source regions CSR.

After the common source regions CSR are formed, insulation spacers SP and common source plugs CSP may be formed in the trenches T. The insulation spacer SP may cover opposite sidewalls of the electrode structure ST. A second interlayer dielectric layer 60 may be formed on the first interlayer dielectric layer 50, and as shown in FIG. 24, subsidiary lines SBL1 to SBL4 and first and second bit lines BL1 and BL2 may be formed on the second interlayer dielectric layer 60.

Figure 34:
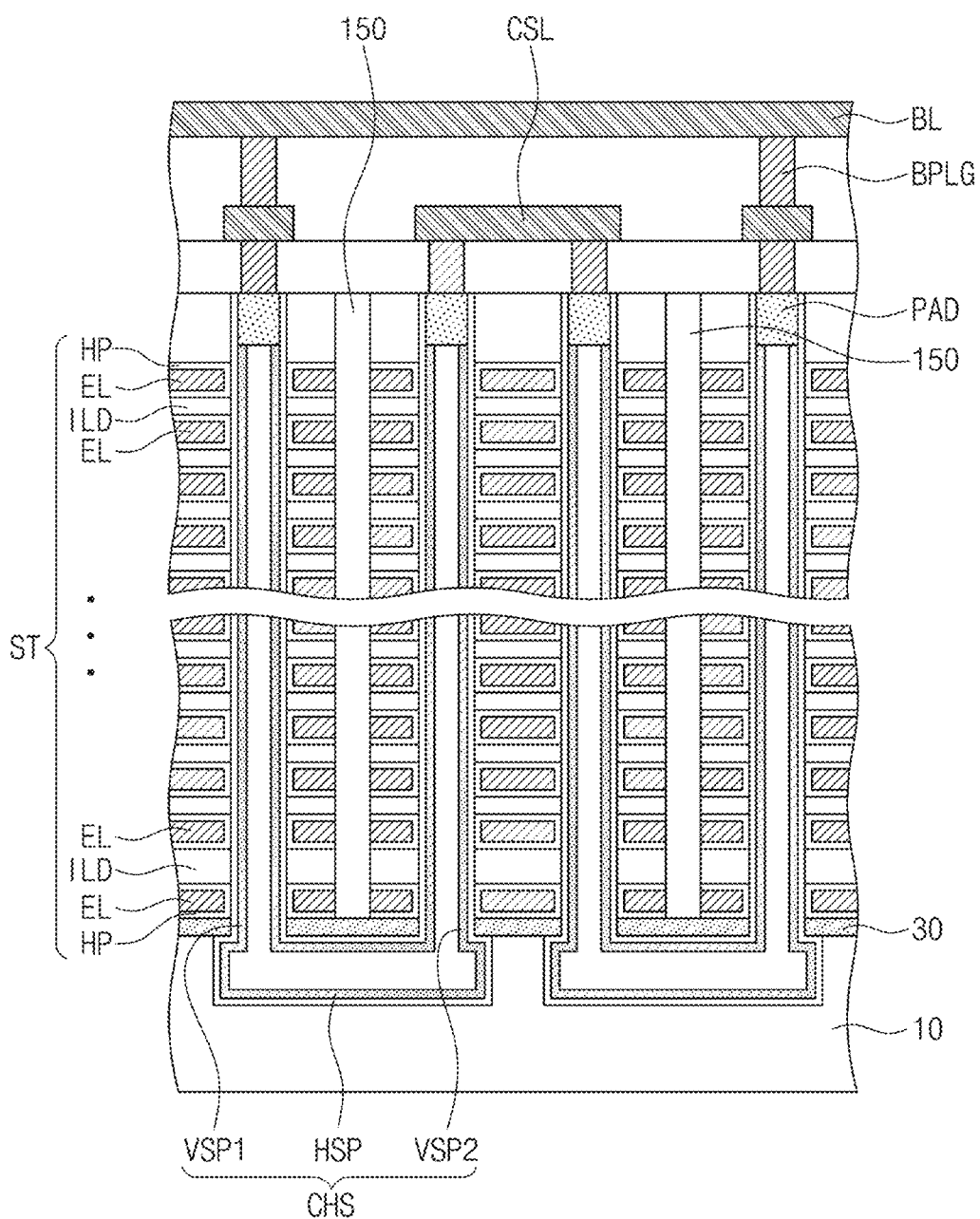
FIG. 34 illustrates a cross-sectional view of a three-dimensional semiconductor memory device according to an example embodiment of the present inventive concepts.

FIG. 34 illustrates a cross-sectional view of a three-dimensional semiconductor memory device according to an example embodiment of the present inventive concepts.

Referring to FIG. 34, a substrate 10 may be provided thereon with electrode structures ST spaced apart from each other. In some example embodiments, an etch stop layer 30 may be between the substrate 10 and the electrode structures ST. The etch stop layer 30 may be the amorphous boron layer discussed with reference to FIGS. 1A to 1E.

Each of the electrode structures ST may include electrodes EL and insulation layers ILD alternately stacked on the etch stop layer 30. For example, the electrode structures ST may extend in a single direction, and a separation insulation layer 150 may be between the electrode structures ST.

A channel structure CHS may be provided to include first vertical semiconductor pillars VSP1 penetrating a first electrode structure among the electrode structures ST, second vertical semiconductor pillars VSP2 penetrating a second electrode structure among the electrode structures ST, and a horizontal semiconductor pattern HSP connecting the first and second semiconductor pillars VSP1 and VSP2.

The first and second vertical semiconductor pillars VSP1 and VSP2 may be provided in vertical holes penetrating the electrode structures ST. Each of the first and second semiconductor pillars VSP1 and VSP2 may include a conductive pad PAD at or on a top end thereof. The first vertical semiconductor pillar VSP1 may be connected to one of bit lines BL, and the second vertical semiconductor pillar VSP2 may be connected to a common source line CSL.

The horizontal semiconductor pattern HSP may be provided in a horizontal recess region formed in the substrate 10. The horizontal semiconductor pattern HP may extend from below one electrode structure ST toward below another electrode structure ST to horizontally connect the first and second vertical semiconductor pillars VSP1 and VSP2 to each other.

According to some example embodiments of the present inventive concepts, electrodes vertically stacked on a substrate may extend from a cell array region toward a connection region, while having a uniform thickness. Because contact plugs are stably coupled to corresponding electrodes, vertically neighboring electrodes may be simultaneously and separately connected to corresponding contact plugs, respectively, and thus may be prevented from being electrically connected to each other.

Although the present inventive concepts has been described in connection with some example embodiments illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. A three dimensional (3D) semiconductor memory device comprising:
    a substrate including a cell array region and a connection region;
    a stack structure comprising a plurality of electrodes and a plurality of insulating layers vertically and alternately stacked on the substrate, the stack structure having a first staircase structure formed along a first direction on the connection region and a second staircase structure formed along a second direction crossing the first direction on the connection region; and
    an etch stop layer covering the first and second staircase structures of the stack structure, the etch stop layer comprising an amorphous boron layer,
    wherein the first staircase structure comprises a plurality of first stairs, each of the first stairs comprising two or more vertically adjacent electrodes of the electrodes,
    wherein the second staircase structure comprises a plurality of second stairs, each of the second stairs comprising one of the electrodes, and
    wherein the first and second directions are parallel to a top surface of the substrate.

2. The semiconductor device of claim 1, wherein the etch stop layer has a substantially uniform thickness on sidewalls of the first stairs and the second stairs.

3. The semiconductor device of claim 1, further comprising:
    a plurality of contact plugs respectively connected to the electrodes of the stack structure,
    wherein the plurality of contact plugs penetrate the etch stop layer on the connection region.

4. The semiconductor device of claim 3, wherein the plurality of contact plugs are arranged along the first and second directions.

5. The semiconductor device of claim 1, further comprising:
    a first contact plug connected to a lowermost one of the electrodes; and
    a second contact plug connected to an uppermost one of the electrodes,
    wherein each of the first and second contact plugs includes an extended portion extending in a third direction perpendicular to the top surface of the substrate and a contacted portion protruding horizontally from the extended portion and disposed in the etch stop layer.

6. The semiconductor device of claim 1, further comprising:
    a first contact plug connected to a lowermost one of the electrodes; and
    a second contact plug connected to an uppermost one of the electrodes,
    wherein a bottom surface of the first contact plug is located at a first distance from a top surface of the lowermost one of the electrodes, and
    a bottom surface of the second contact plug is located at a second distance from a top surface of the uppermost one of the electrodes, the first distance being different from the second distance.

7. The semiconductor device of claim 6, wherein top surfaces of the first and second contact plugs are located at substantially a same level from the top surface of the substrate.

8. The semiconductor device of claim 1, further comprising:
    a horizontal dielectric layer covering both a top surface and a bottom surface of the electrodes,
    wherein the horizontal dielectric layer includes a material different from a material of the etch stop layer, and
    wherein a portion of the horizontal dielectric layer contacts the etch stop layer.

9. The semiconductor device of claim 8, wherein the etch stop layer is thicker than the horizontal dielectric layer.

10. The semiconductor device of claim 1, wherein the amorphous boron layer contains about 90 to 100 atomic percent of boron.

11. A three dimensional (3D) semiconductor memory device comprising:
- a substrate including a cell array region and a connection region adjacent to the cell array region in a first direction;
- a stack structure comprising a plurality of electrodes and a plurality of insulating layers vertically and alternately stacked on the substrate, the stack structure having a staircase structure formed along the first direction on the connection region, the staircase structure comprising a plurality of first stairs, each of the first stairs comprising two or more vertically adjacent electrodes of the electrodes; and
- an etch stop layer covering sidewalls of the plurality of first stairs, etch stop layer comprising an amorphous boron layer.

12. The semiconductor device of claim 11, wherein sidewalls of the two or more vertically adjacent electrodes of the electrodes are vertically aligned with each other.

13. The semiconductor device of claim 11, wherein the etch stop layer conformally covers the plurality of first stairs.

14. The semiconductor device of claim 11, further comprising:
- a first contact plug connected to a lowermost one of the electrodes; and
- a second contact plug connected to an uppermost one of the electrodes,
- wherein each of the first and second contact plugs includes an extended portion extending in a second direction perpendicular to a top surface of the substrate and a contacted portion protruding horizontally from the extended portion and disposed in the etch stop layer.

15. The semiconductor device of claim 14, wherein the extended portion of the first contact plug has a first width and the extended portion of the second contact plug has a second width, the second width being different from the first width.

16. The semiconductor device of claim 11, further comprising:
- a first contact plug connected to a lowermost one of the electrodes; and
- a second contact plug connected to an uppermost one of the electrodes,
- wherein the first contact plug has a first sidewall facing the etch stop layer and the second contact plug has a second sidewall facing the etch stop layer, and
- wherein the first sidewall has at least one of a substantially vertical shape or a rounded shape and the second sidewall has an inclined shape.

17. The semiconductor device of claim 11, further comprising:
- a first contact plug connected to a lowermost one of the electrodes; and
- a second contact plug connected to an uppermost one of the electrodes,
- wherein a bottom surface of the first contact plug is located at a first distance from a top surface of the lowermost one of the electrodes, and
- a bottom surface of the second contact plug is located at a second distance from a top surface of the uppermost one of the electrodes, the first distance being different from the second distance.

18. The semiconductor device of claim 11, wherein the amorphous boron layer contains about 90 to 100 atomic percent of boron.

19. The semiconductor device of claim 11, further comprising:
- a vertical structure on the cell array region and penetrating the stack structure; and
- a horizontal dielectric layer disposed between the vertical structure and the electrodes and covering both a top surface and a bottom surface of each of the electrodes,
- wherein a portion of the horizontal dielectric layer on the connection region is between the etch stop layer and top surfaces of the electrodes.

20. The semiconductor device of claim 19, wherein the horizontal dielectric layer includes a material different from a material of the etch stop layer.

* * * * *